United States Patent [19]

Lemelson

[11] 4,207,154
[45] Jun. 10, 1980

[54] WAVE GENERATING APPARATUS AND METHOD

[76] Inventor: Jerome H. Lemelson, 85 Rector St., Metuchen, N.J. 08840

[21] Appl. No.: 93,779

[22] Filed: Nov. 30, 1970

Related U.S. Application Data

[63] Continuation-in-part of Ser. No. 668,561, Jun. 27, 1957, abandoned.

[51] Int. Cl.² .............................................. B01J 1/12
[52] U.S. Cl. ............................ 204/157.1 S; 204/193; 204/158 S
[58] Field of Search ............. 204/193, 157.1 S, 158 S; 23/1 R, 252 B, 284, 285

[56] References Cited

U.S. PATENT DOCUMENTS

| | | | |
|---|---|---|---|
| 2,745,861 | 5/1956 | Bodine | 204/193 |
| 3,348,814 | 10/1967 | Shaw | 259/1 |

*Primary Examiner*—Howard S. Williams

[57] ABSTRACT

An apparatus for reacting on matter with shock waves which are directed through or against said matter. In one form, the shock waves are generated intermittently for an extended period of time, during which time the work is subjected to the high temperatures and pressures of the shock waves. Both chemical and physical changes may be effected in the material reacted on by the shock waves.

Where a plurality of shock waves are directed against the same matter to progressively change same, the apparatus includes means for amplifying the shock waves to increase the intensity of the individual waves and enhance or improve the reactive effects.

In another form of the invention, a plurality of shock waves are simultaneously generated in different zones of a reaction chamber and are directed into a reaction zone containing matter to be reacted upon by simultaneously subjecting said matter to the heat and pressure of each of the shock waves directed thereagainst.

22 Claims, 53 Drawing Figures

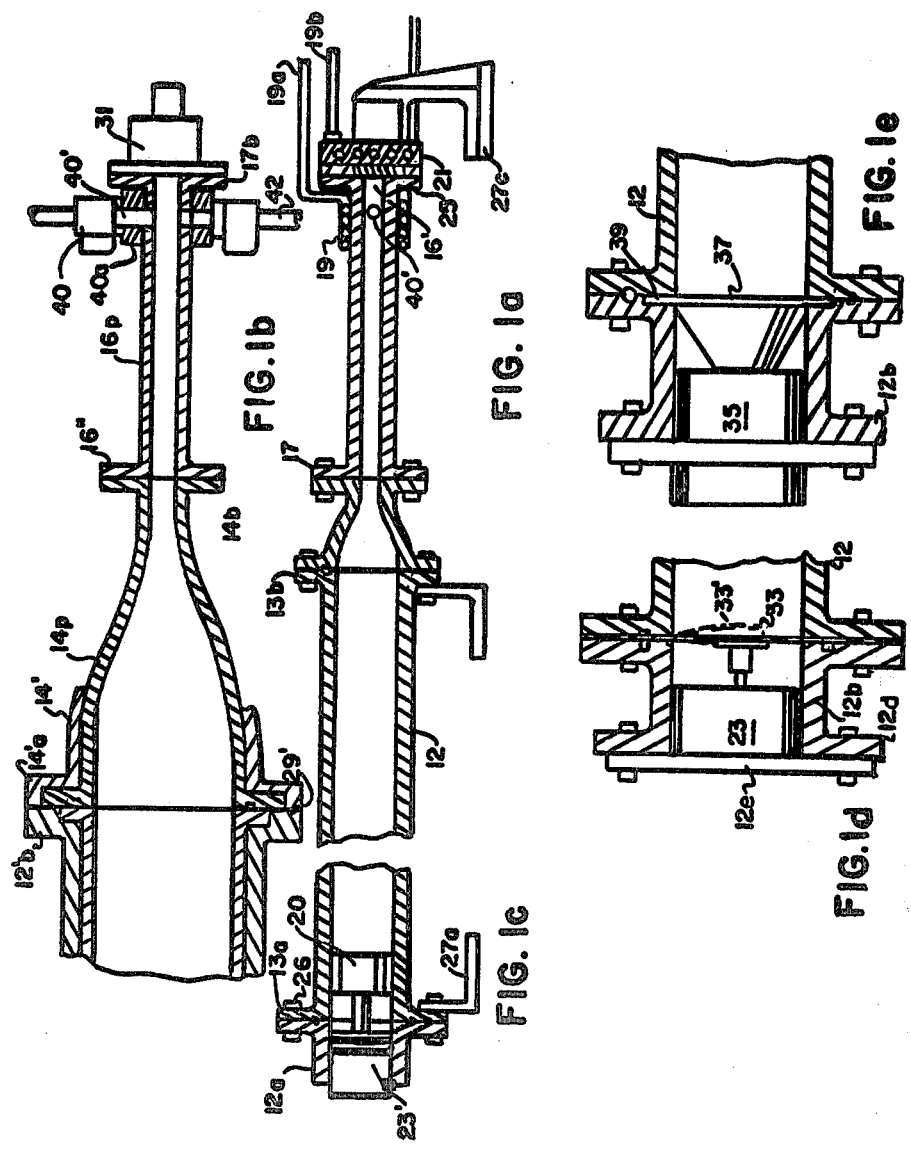

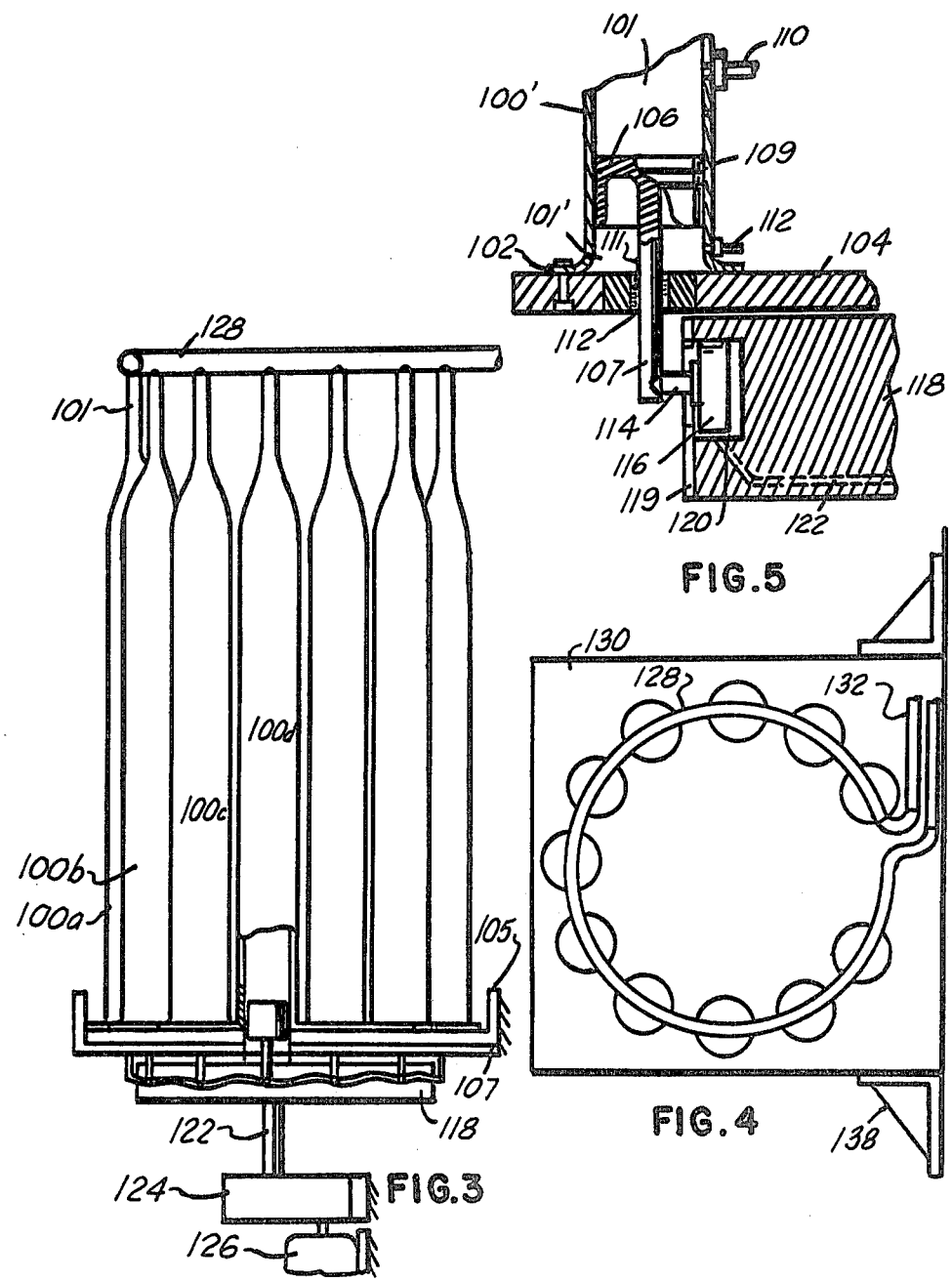

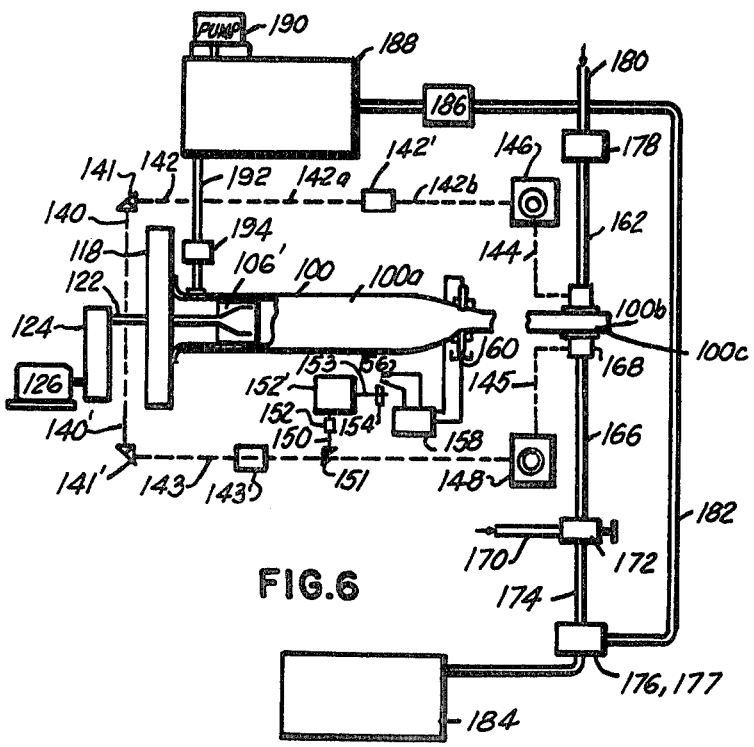
FIG.6
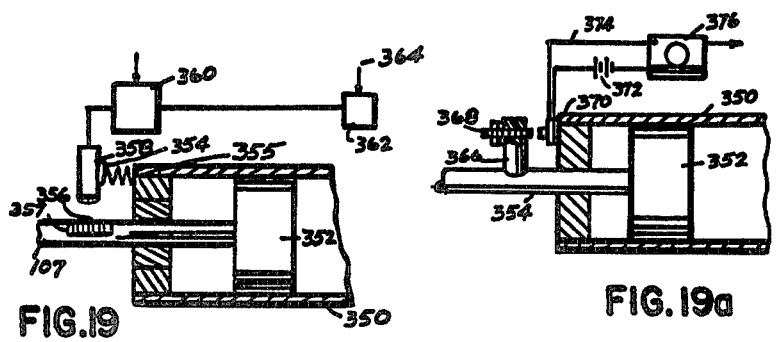
FIG.19
FIG.19a

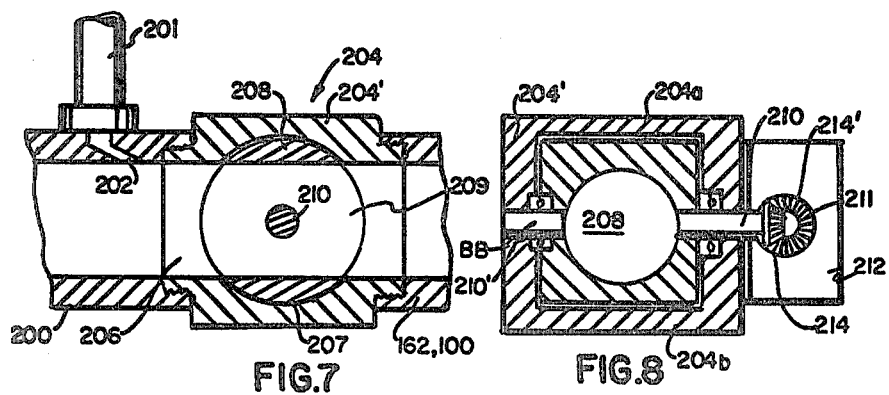
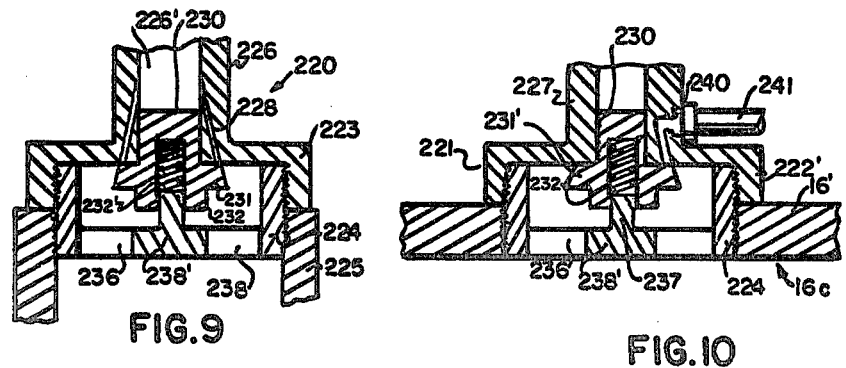
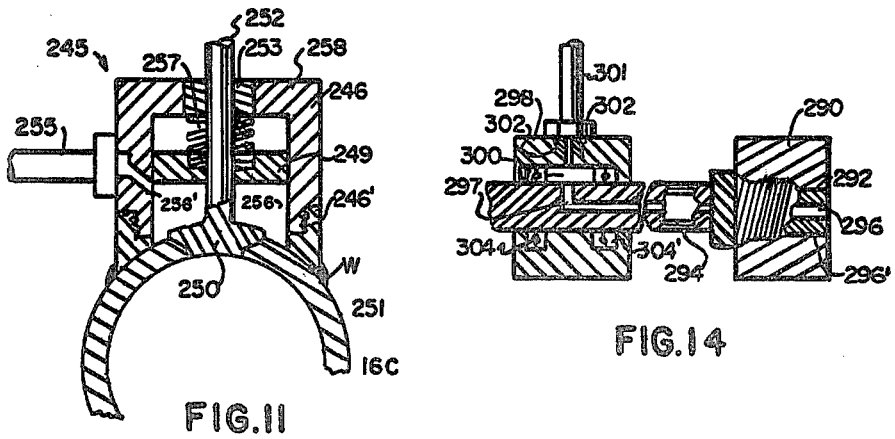

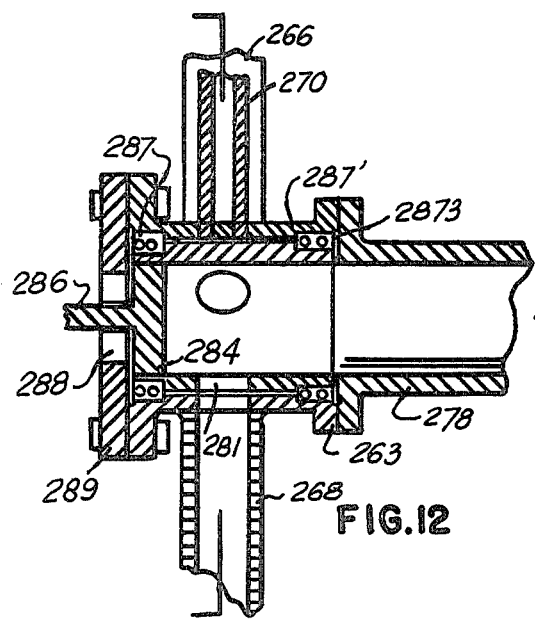
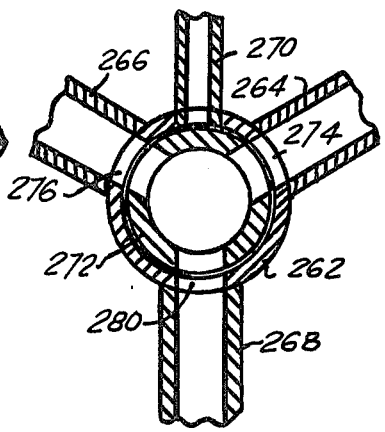
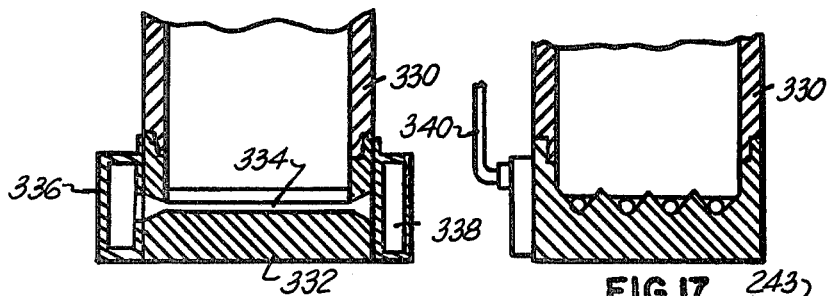
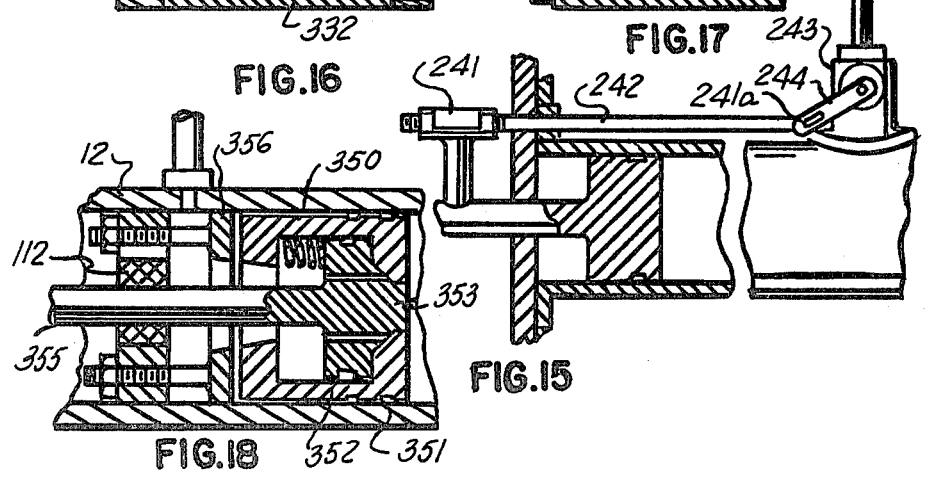

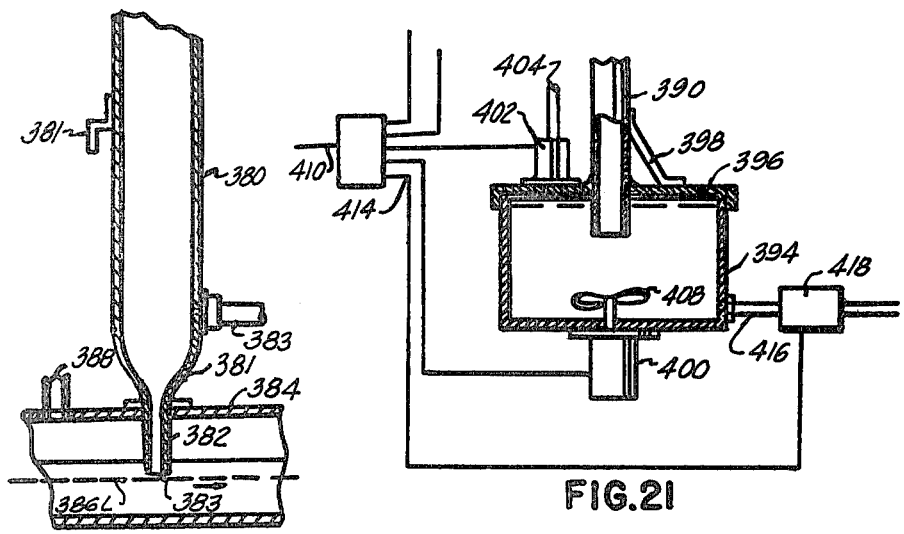
FIG.20  FIG.21
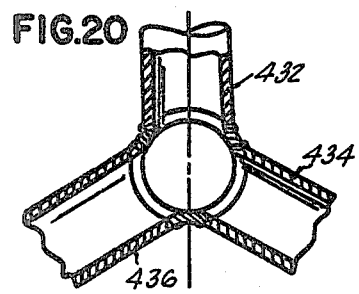
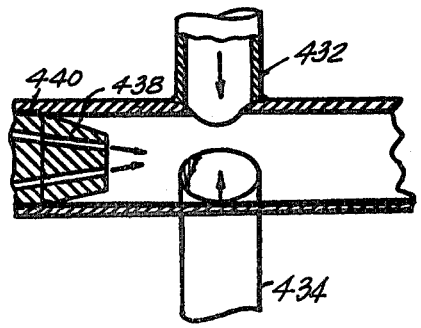
FIG.22  FIG.23
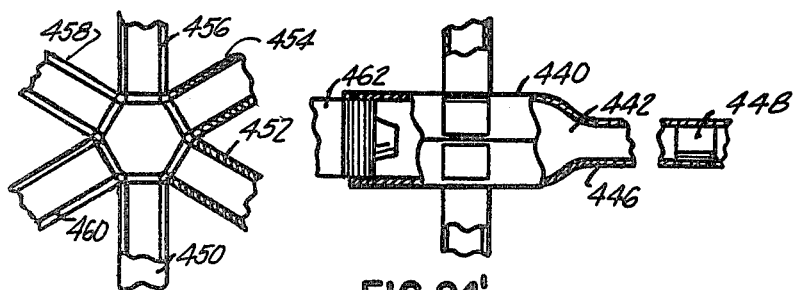
FIG.24  FIG.24'

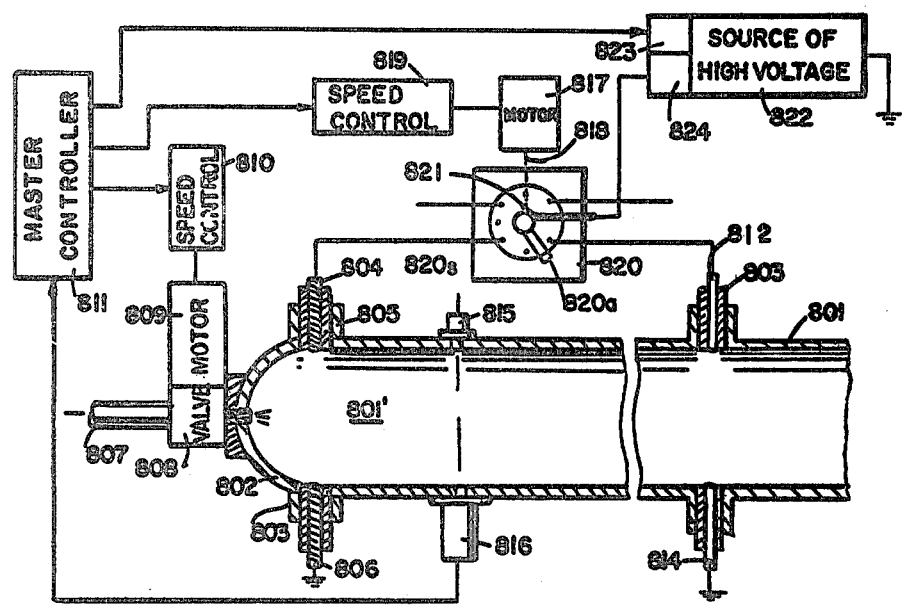
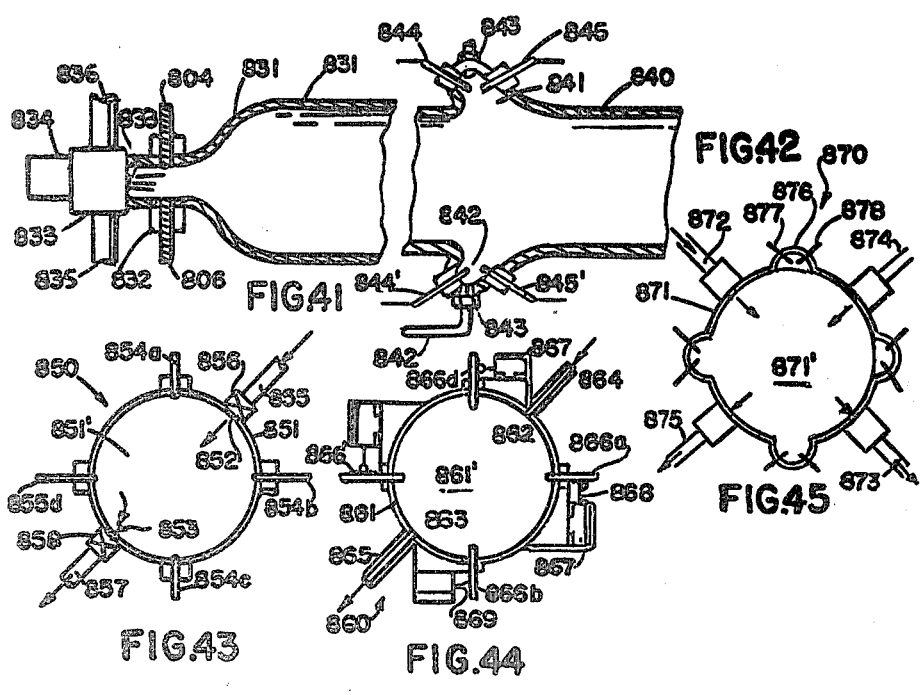

WAVE GENERATING APPARATUS AND METHOD

RELATED APPLICATIONS

This is a continuation-in-part of application Ser. No. 668,561 filed June 27, 1957, for Wave Generating Apparatus, now abandoned.

SUMMARY OF THE INVENTION

This invention relates to wave generating apparatus and methods for reacting on matter by means of intense shock waves, which may be generated in gaseous or liquid media comprising the matter to be reacted on or comprising a wave conducting medium which is coupled to the surface of a liquid or solid material or contains matter to which energy is to be transferred by means of shock waves.

The conventional so-called shock tunnel or shock tube provides means for the generation of a single shock wave therein which shock wave is generally directed along the tunnel against a model, with the results observed by means of photography for analyzing the aerodynamic effects of the model. Such a shock tube is an elongated metal duct divided by a diaphragm into low and high pressure regions wherein a driver gas, usually helium, is released suddenly from the high pressure region by puncturing the diaphragm, resulting in the development of a shock wave as the gas enters a low pressure region. Large shock tubes have been developed in which shock waves have been generated in the working or low pressure region of the tube in excess of 20 times the speed of sound and temperatures associated with said shock waves have been observed in excess of 32,000° F. (i.e.—in the wave front of the shock wave). While these devices produce sufficiently high energy waves to do work, the short duration of the existence of the single shock wave and the effort and time required to repeat the action are factors which limit the use of such apparatus for test purposes.

This invention relates to an apparatus and method for generating, augmenting and utilizing high-intensity pressure waves such as shock waves directed into reaction chambers for creating chemical and, in certain instances, physical changes in fluids and solids. It is known in the art that various chemical reactions which are difficult or uneconomical to attain at so-called low temperatures (below 2500° F.) and at pressures in the range of atmospheric pressure can be made to occur rapidly and efficiently at higher temperatures and pressures. Certain difficulties are experienced in attempting to attain high temperatures and pressure by conventional means employing conventional combustion, electrical energy, etc. such as energy input requirements, heat corrosion, heat loss in process, and the effects of prolonged application of heat to the process chemicals. The instant invention employs one or more means for generating one or more shock waves in a fluid medium which may be the so called working fluid, the reacting fluid or a combination of both intermixed or in interfacial relationship with each other such as two gases, a gas and and liquid or two liquids in either or both of which shock waves are generated and propagated. Depending on the intensity of the source of the shock wave which may comprise an electrical spark, explosion, mechanical oscillator and amplifying means or one or more intense radiation beams, temperatures existing in a moving shock wave may equal or exceed one million degrees Farenheit and may be used as described herein to effect chemical and physical changes in matter subjected thereto. One or more lasers or electron guns may be employed and directed to generate one or more intense beams operable to generate shock waves as described hereafter.

A primary object of this invention is to provide improvapparatus and methods for generating and applying shock waves to matter.

Yet another object is to provide improved means for generating and augmenting shock waves in reaction chambers by the sudden release of intense radiant energy.

Another object is to provide an apparatus and method for generating and augmenting shock waves by means of intense arcing or generating sparks in a gaseous or liquid medium.

Another object is to provide an apparatus and method for generating and augmenting shock waves in a gaseous, liquid or solid medium by generating intense radiant energy by means of a laser or electron beam generating gun and directing same into a gas, liquid or a solid.

Another object is to provide an apparatus and method for deforming matter by means of the intense pressures generated by a plurality of shock waves directed against the matter.

Another object is to provide a shock wave generating apparatus and method capable of coating or eroding matter.

Another object is to provide improvements in apparatus which is applicable for high-temperature reactions such as that defined by the apparatus herein.

With the above and such other objects in view as may hereinafter more fully appear, the invention consists of the novel constructions, combinations and arrangements of parts as will be more fully described and illustrated in the accompanying drawings, but it is to be understood that changes, variations and modifications may be resorted to which fall within the scope of the invention as claimed.

In the drawings:

FIG. 1a is a side view with parts broken away for clarity of a modified form of the apparatus of FIG. 1;

FIG. 1b is a side view with parts broken away for clarity of a modified form of the apparatus of FIG. 1a;

FIG. 1c is a side view with parts broken away for clarity of a modified form of piston drive means for gas associated with the apparatus of FIGS. 1 and 2;

FIG. 1d is a side view with parts broken away for clarity of a diaphragm type piston applied to a shock tube of the type illustrated in FIG. 1;

FIG. 1e is a side view with parts broken away for clarity showing an ultrasonic whistle connected to a shock tube;

FIG. 3 is a side view with parts broken away for clarity of a multiple shock tube apparatus;

FIG. 4 is an end view of an apparatus of the type shown in FIG. 3;

FIG. 5 is a fragmentary view with parts broken away for clarity of part of the apparatus of FIGS. 3 and 4;

FIG. 6 is a schematic diagram showing control components for an apparatus of the type shown in FIGS. 1-5;

FIG. 7 is a cross-sectional side view of a power-operated valve applicable to the apparatus of FIGS. 1-6;

FIG. 8 is a cross-sectional view in end elevation of the valve of FIG. 7;

FIG. 9 is a fragmentary side view in cross-section of a modified form of valve applicable to the apparatus of FIGS. 1-6;

FIG. 10 is a cross-sectioned side view of another form of valve applicable to the apparatus of FIGS. 1-6;

FIG. 11 is a cross-sectional view taken in end elevation of another form of valve application to the apparatus of FIGS. 1-6;

FIG. 12 is a fragmentary view of a modified form of the end of a shock chamber of the type shown in FIGS. 1-6;

FIG. 13 is an end elevational view taken in cross-section of the valve of FIG. 12;

FIG. 14 is a side cross-sectional view of a fluid injector applicable to the apparatus of FIGS. 1-6;

FIG. 15 is a side view with parts broken away for clarity of the working end of a reaction chamber of the type shown in FIGS. 2 and 6;

FIG. 16 is a side view in cross-section of the end of another form of reaction chamber within the purview of the instant invention;

FIG. 17 is a side view in cross-section of yet another form of reaction chamber;

FIG. 18 is a side view in cross-section of a form of valve applicable to the apparatus of FIGS. 1-6;

Figure 1:
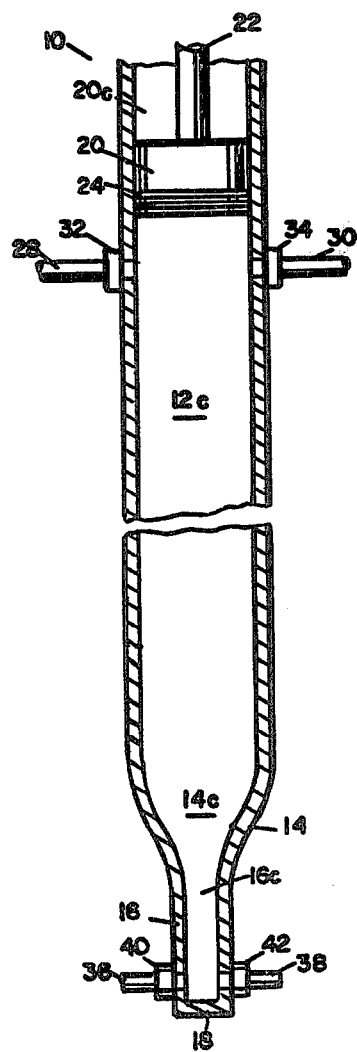
FIG. 1 is a side view with parts broken away for clarity of a wave generating apparatus employing piston means to generate and amplify compression and shock waves.
Figure 2:
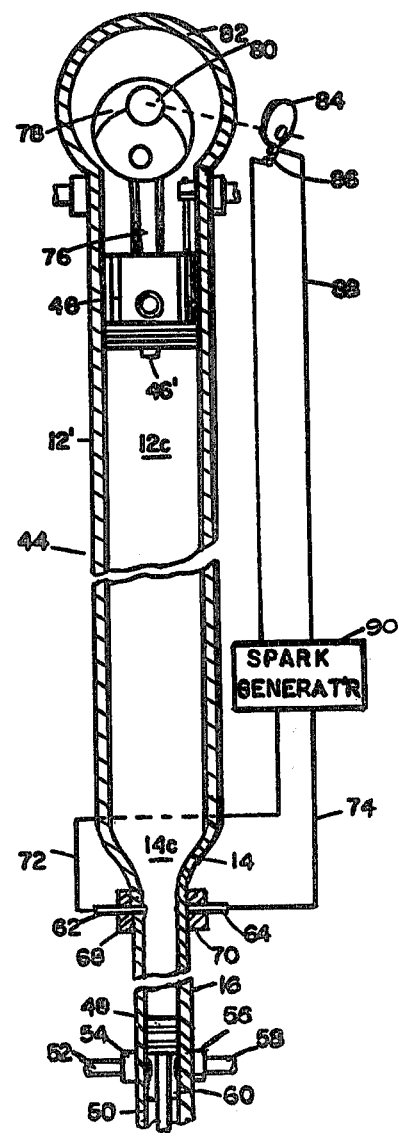
FIG. 2 is a side view with parts broken away for clarity of a modified form of the apparatus of FIG. 1 including spark-generating means for forming and amplifying shock waves.
Figures 37, 38:
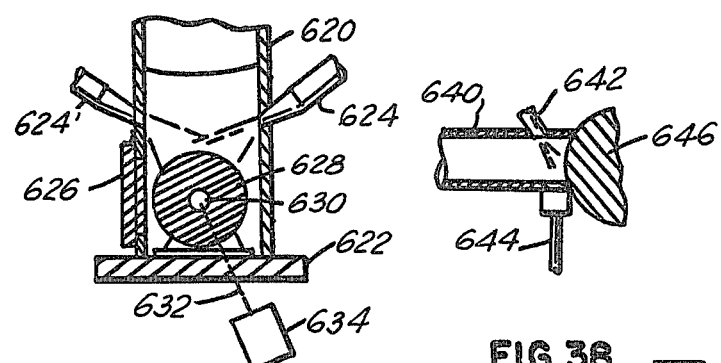
Figure 19C:
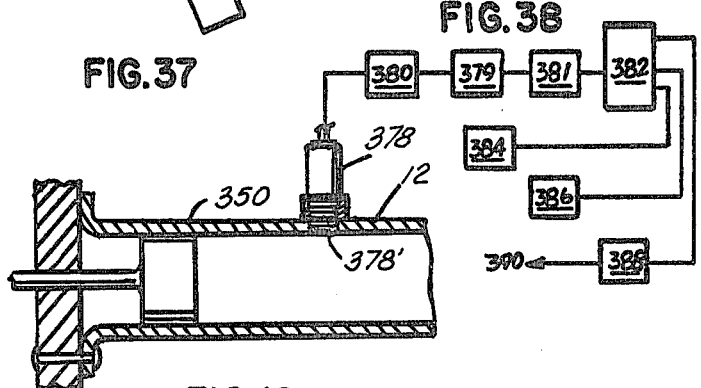
FIG. 19 is a side view in cross-section of a timing control applicable to the apparatus of FIGS. 2 and 6.
FIG. 19a is a side view in cross-section of another form of timing control.
Figure 39:
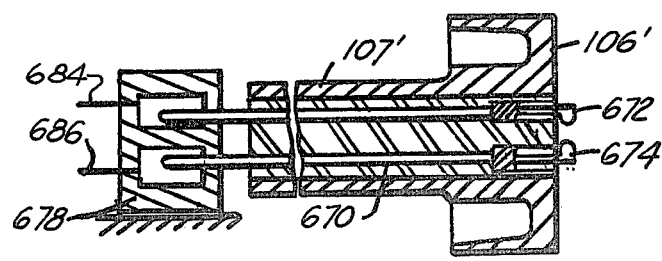
Figure 25:
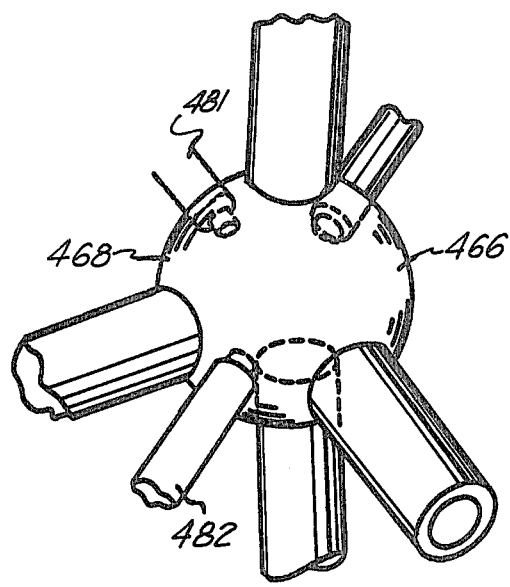
Figures 26, 28:
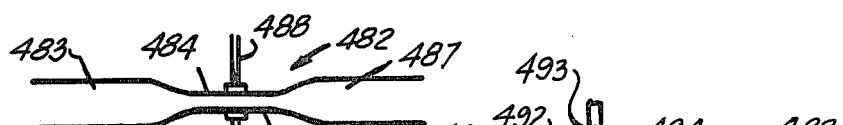
Figure 27:
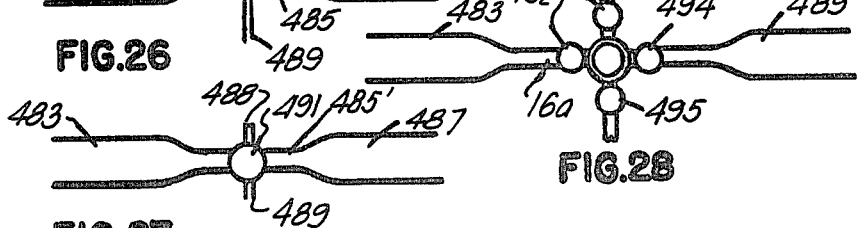
Figure 29:
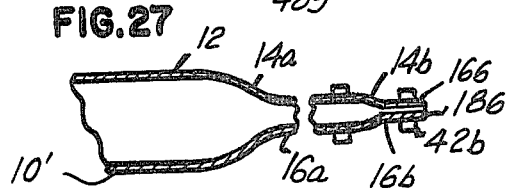
Figure 30:
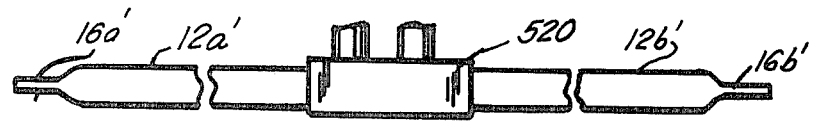
Figure 31:
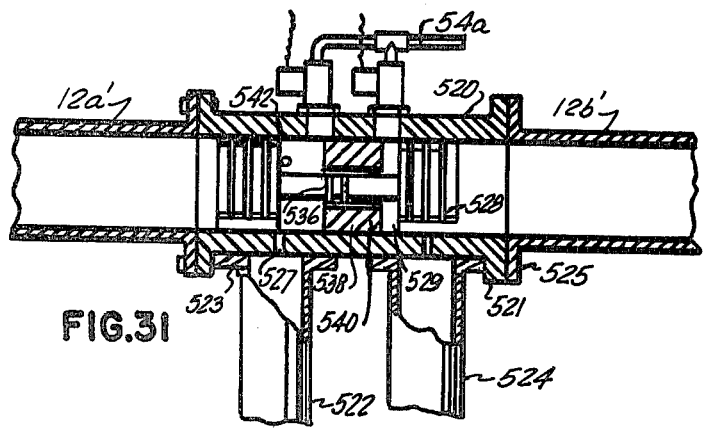
Figure 32:
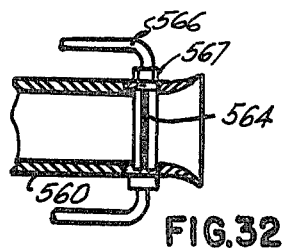
Figure 33:
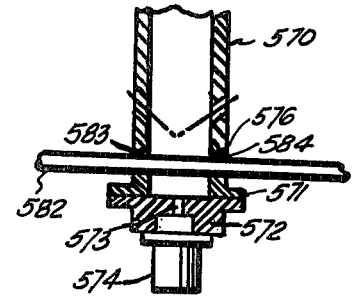
Figure 34:
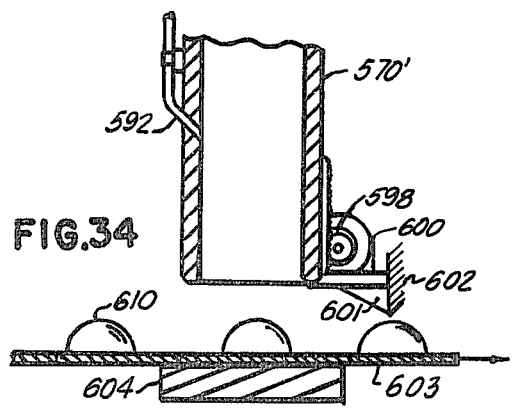
Figure 35:
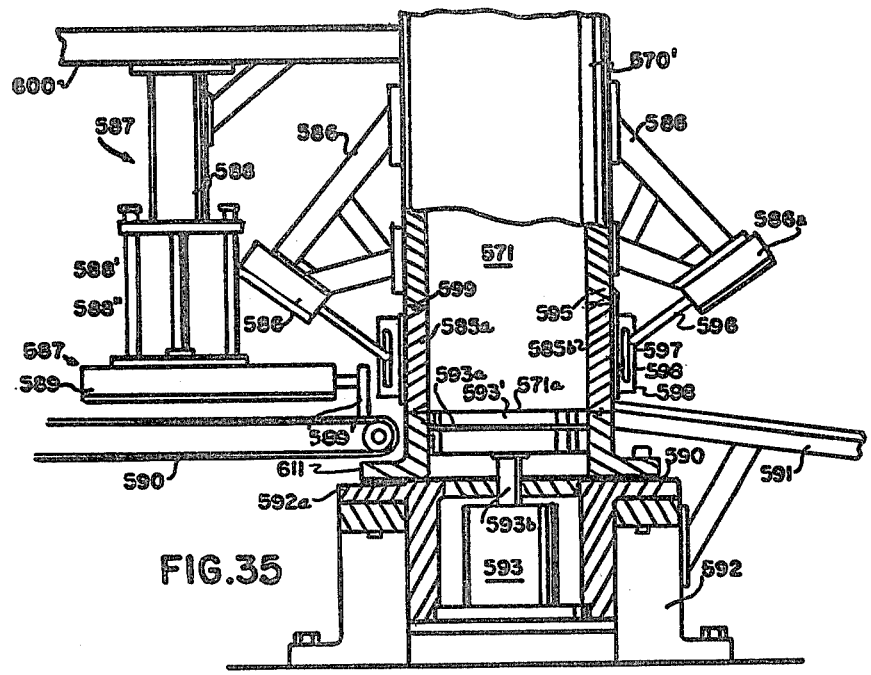
Figure 36:
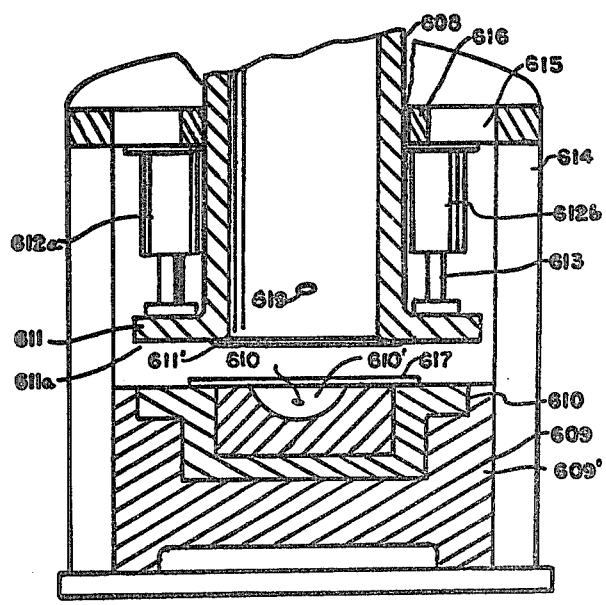

FIG. 19C of another form of timing control;

FIG. 20 is a side view in cross-section of a modified form of the apparatus of FIGS. 1, 2 and 6, which is operable to perform reactions on a liquid in the conduit;

FIG. 21 is a side view in cross-section of a modified form of the apparatus of FIG. 20;

FIG. 22 is an end view in cross-section of a reaction chamber employing three shock tubes angulated with respect to each other and discharging into a common reaction zone;

FIG. 23 is a side view in cross-section of the apparatus of FIG. 22;

FIG. 24 is an end view in cross-section of a modified form of the apparatus of FIG. 22;

FIG. 24' is a side view with parts broken away for clarity of an apparatus of the type shown in FIG. 24;

FIG. 25 is an isometric view of a reaction chamber employing a plurality of shock tubes operatively coupled to said chamber;

FIG. 26 is a side-elevational view of shock wave generating apparatus applicable to the apparatus of FIGS. 1-6;

FIG. 27 is a side-elevational view of a modified form of that shown in FIG. 26;

FIG. 28 is a side elevational view of yet another modified form of the apparatus shown in FIGS. 26 and 27;

FIG. 29 is a side-elevational view of a fragment of a modified form of reaction apparatus of the type shown in FIGS. 26-28;

FIG. 30 is a side-elevational view of yet another form of reaction apparatus employing a free piston to generate shock waves in a plurality of shock tubes;

FIG. 31 is a fragmentary view of the apparatus of FIG. 30 with parts broken away for clarity;

FIG. 32 is a side-elevational view of a modified form of fluid dispensing apparatus employing features of the invention;

FIG. 33 is a side-elevational view in cross-section of the end of a shock tube modified to receive and locate a member to be coated by means of shock waves;

FIG. 34 is a side-elevational view of a modified form of reaction apparatus for reacting on articles disposed on a conveyor;

FIG. 35 is a side view with parts broken away for clarity of a modified form of reaction chamber for reacting on small articles which are automatically fed thereto and removed therefrom;

FIG. 36 is a side view with parts broken away for clarity of part of a reaction apparatus operable to deform sheets and plates into a die;

FIG. 37 is a side-elevational view of a reaction chamber and an article therein to be coated;

FIG. 38 is an end-elevational view with parts broken away for clarity of a work piece and a shock wave generating apparatus coupled thereto;

FIG. 39 is a side view in cross-section of a modified form of piston and spark-generating means applicable to the apparatus of FIG. 2;

FIG. 40 is a side-elevational view of part of a reaction chamber cross-sectioned and provided with spark discharge means for generating and amplifying shock waves;

FIG. 41 is a side view in cross-section of a fragment of a modified form of shock wave generating apparatus employing spark discharge means;

FIG. 42 is a side view in cross-section of a modified form of the apparatus of FIG. 41;

FIG. 43 is an end elevational view of a modified form of the apparatus of FIG. 41 and 42;

FIG. 44 is an end-elevational view of a modified form of the apparatus of FIG. 42;

FIG. 45 is an end-elevational view of a modified form of the apparatus of FIG. 44.

In an important form of the invention, shock waves are created in rapid succession in a reaction chamber or shock tube and are passed in rapid succession into and through a working region of a said tube to create chemical and/or physical changes in matter such as a fluid or fluids through which said waves pass by the action of the temperature generated in the wave fronts of said shock waves and/or the pressure effects of said waves. In one form, an oscillating piston is utilized to physically impart kinetic energy to the gas or fluid in a tube and by oscillating at a predetermined frequency which may be considered the resonant frequency of the fluid in said tube configuration, said piston may be used to set up a wave motion therein which is augmentive in effect on each successive pressure purturbation and/or on an oscillating pressure wave set up in at least part of said tube such that said pressure wave develops into a shock wave. The shock wave oscillating in the range of 25 to 100 or more cycles per section, or waves generated at such frequencies, in the working region of the shock tube may then be used to compress a fluid therein and to transfer part of their thermal energy to said fluid to create chemical reactions. Whereas, for certain reactions and physical changes in matter as provided hereafter, may be effected by shock waves generated by detonation, or explosions which are herein proposed for use in the apparatus to be described where application disadvantages of explosives created shocks include possible chemical interaction between the detonation products and the desired end-products as well as possible higher equipment and operating costs.

Temperatures for microsecond periods in the order of 450,000° to 1,000,000° F. in helium and deuterium may be effected utilizing short time electrical discharges at very high current densities. Spark discharge means may therefore be provided per se or combined with said mechanical means for creating and augmenting shock waves to create chemical and physical changes in matter.

In the apparatus to be described hereafter, one or more modes of operation or combinations of modes of operation of shock generating machinery may be employed to produce a particular end effect. The selection of which components, group of components, control valves or configurations to employ will depend on the desired end results and the parameters experienced during the operation of the apparatus in light of the chemical reaction or test requirements.

The basic mode of operation of the wave generating apparatus to be described is effected by the creation of a shock wave phenomenon in a shock tube or reaction chamber of a characteristic such that a multiplicity of shock waves may be rapidly generated, preferably at a predetermined and fixed frequency in a fluid and used to effect chemical and physical changes in matter by virtue of the high temperature effects of said shock waves, and/or the high compression pressures resulting from the convergence of said shock waves toward each other and/or their movement in a fluid towards a surface or surfaces.

One form of the invention utilizes a reaction chamber which will hereafter be referred to as an intermittent shock tube. Unlike the conventional shock tube which employs a single shock wave generated therein, the hereinafter described intermittent shock tube provides a shock phenomenon which includes means for generating and causing one or more shock waves caused to oscillate back and forth in a duct.

The conventional so-called shock tube is a metal tube divided by a diaphragm into a low pressure and a high pressure section. Driver gas, released from the high pressure section by puncturing the diaphragm develops a shock wave as it enters the low pressure region at 17 to 20 times the speed of sound. Temperatures up to 32,000° F. have been observed in this wave front.

The operation of the proposed intermittent shock tube may be effected by one or combinations of the following wave generating techniques, any of which may be applicable to the various configurations to be described.

(1) The discharge of an intense spark or laser light beam into a chamber or closed tube will create a shock wave, the characteristics (velocity and temperature value) of which will be a function of the intensity of the spark or light energy, the configuration of the tube and the characteristics of the fluid in which said shock is generated. Certain of the shock wave devices provided hereafter may utilize an intermittently generated spark or light beam in an enclosed reaction chamber to provide a series of intermittent high intensity shock waves through a test or working section of said chamber.

(2) Impulse means employing a modified ballistic piston preferably driven in short stroke oscillating motion at frequencies in the range of 2000 to 10,000 cycles per minute to set up transient wave motions in an enclosed duct or reaction chamber which are augmented or amplified by acoustic resonant effects as well as shaping said chamber, if necessary, to create a travelling shock wave or shock waves in said chamber which pass through a test section thereof at high frequency. The cumulative or additive effects of the intermittently appearing shock waves in said test section may be used to heat a fluid or solid member to high temperatures and to subject said fluid or solid to high intermittent pressures. Since the high temperatures and pressures generated are transient phenomena and exist in the fluid in which the shock wave is generated for microsecond periods, the result on the gas molecules is an instantaneous heating to high temperature followed immediately thereafter by a rapid cooling. This rapid cooling from high temperature may be used to advantage in various chemical reactions involving gases including fixation processes such as nitrogen fixation whereby chemical changes occur and remain as a result of said rapid inflection in temperature and/or pressure.

(3) Combinations of spark discharge and mechanical or laser drive means such as said oscillating piston in which both means coact to provide multiple intermittent shock waves of increased or amplified intensity in a test or working region of a reaction chamber or shock tube.

(4) Rapid combustion explosive detonation or chemical reactions involving heat occurring at a predetermined frequency may be employed in the apparatus described herein per se or in coaction with electrical and/or mechanical means of the type described in (2), or by means of intense light beams as described.

(5) Other electro-mechanical driving means may be employed to create said intermittent pressure disturbances in said primary section 12 of duct 10. A vibratable diaphragm or membrane such as the sound producing diaphragm of a speaker or horn driven by electromagnetic means and adapted to vibrate at relatively high amplitudes (in the order of 1/64th to ⅛ inch or more) may be utilized in place of the piston 20 of FIG. 1, 46 of FIG. 2 or in the other apparatus of the invention. Said diaphragm would preferably extend across the diameter of the tube section 12 in the position of the piston or at least the frame or rim on which said diaphragm or vibrating plate would extend across and close off the head end of the section 12 in the position of the piston. The numeral 23 of FIG. 1d may be considered as the speaker or horn body secured in the section 10a and operatively communicating with the chamber 10c with the piston 20 and piston shaft removed from the drawing. Since a diaphragm or speaker plate would be easier to vibrate at higher frequencies than the piston due to its lighter mass, it may be applied to advantage when operating in the higher frequency wave motion range.

FIG. 1 illustrates an apparatus for creating intermittent shock waves and utilizing said shock waves to effect chemical reactions on a fluid or fluids admitted to a working region of said apparatus. The apparatus comprises an elongated tube or duct 10 having an oscillatable piston 20 slidably engaged in an enlarged diameter section 12 of said duct and apparatus for admitting a fluid or fluids such as a gas or liquid to a reduced diameter section 16 situated beyond the other end of section 12 and communicating with the latter through a coupling section 14 of smooth tapered or inflected curve contour as illustrated. The entire interior of the elongated duct 10 is preferably smoothly finished to reduce the effects of wall friction. Means, not illustrated in FIG. 1, are provided for oscillating the piston 20 preferably in the range of 40 to 100 cycles per second or more at displacements in the range of ⅛ inch to one inch or more which will be limited, of course, by the frequency as well as the capabilities of the apparatus driving said piston.

By providing the correct configuration of duct 10 and by oscillating the piston 20 at or near the natural gas dynamical frequency of the configuration of 10, shock waves may be formed in the fluid therein and caused to oscillate in the reduced diameter section 16 which section is shown closed off with an end wall 18. These waves may be used to heat the fluid therein as well as any fluid or solid matter introduced therein to create chemical and physical changes in said matter.

In a typical configuration, if the bore of chamber section 12 is 4 to 6 inches, the bore of reduced section 16 about an inch, the length of section 12 about 12 feet with section 16 about two feet, and if the piston 20 is driven at 50 to 60 cycles per second, shock waves in excess of Mach 2 in intensity will develop and oscillate in section 16. The maximum Mach value of the shock wave will be a function of the characteristics of the fluid in the duct 10, the degree it is under pressure, the shape of the configuration, displacement and frequency of oscillation of the piston 20, and purturbations set up by introducing a fluid or fluids into said chamber during operation of said piston. Pressure waves set up in the larger section 12 drive the fluid in the reduced section 16 through the intermediary section 14. A compression effect is provided at the coupling section 14 which will be augmentive or amplifying in nature if the fluid motion in the adjacent sections 12 and 16 are what could be considered in phase. The fluid wave in section 16 may thus develop into a wave motion which includes a shock wave or waves which travel to the end and reflect off the end wall 18. Thereafter the reflected wave travels back towards section 14. When the ratio of the length of section 12 is approximately six times the length of section 16 and the piston 20 is oscillated in the range of 3000 to 4000 times per minute, for diameters in the ranges of 4 to 6 inches for section 12 and ½ to 1½ inches for section 16, the pressure waves generated in 12 will create shock wave effects in 16 which will reach peak values when the frequency of piston 20 is adjusted to create said values. This will occur when the pressure waves set up in section 12 reach the section 14 or beyond at approximately the same time the reflected wave in section 16 reaches or approaches said section 14 so that a summing or cumulative energy effect is attained and maximum kinetic energy is transmitted from the waves in section 12 to those in section 16. As the chamber 10 is pressurized, the intensity of the shock wave produced in section 16 will increase. The numerals 28 and 30 refer to fluid piping connected in sealing engagement with the chamber section 12, for pressurizing said chamber interior volume 12c. Either or both fluid lines 28 and 30 thus terminate a source of reservoir of driver or working fluid.

Fluid lines 29 and 30 may also be used to introduce and/or remove fluid or fluids from the chamber 10. For this purpose, and to prevent perturbations in the duct 10 due to wave motion in said tubes 28 and 30 valves 32 and 34 are provided flush with the walls of said chamber, which valves may be controllably operated to open and close at predetermined time intervals after multiple pressure cycles have occurred in said apparatus or during specific times during each cycle. Also illustrated in FIG. 1 are a pair of fluid ducts 36 and 38 and respective valves 40 and 42 mounted flush with the walls of said chamber section 16 and communicating with the interior volume for the purpose of admitting and/or removing predetermined quantities of fluid to the chamber region 16 at predetermined time intervals during each cycle or after a number of cycles. If a predetermined, small quantity of fluid is pulsed through one of the valves 36 or 38 at a specific point in the transient pressure cycle, it may be introduced in a manner so as not to interrupt the shock wave formation and motion therein. This may be accomplished by means to be described, whereby the valve is opened for brief periods of time, said action being synchronized to the wave motion in the duct 10.

The augmenting or amplifying effect on the waves created in section 16 of the duct 10 of FIG. 1 may be explained qualitatively as follows. On the forward stroke, the piston compresses the fluid in front of it and creates a pressure wave which first travels down the duct at the speed of sound. The perturbance enters the restricted section 14 which is designed to permit maximum compression effects on the fluid in the reduced section 16 by the compression waves generated in section 12 by the piston 20 with a minimum of detrimental effects such as energy losses caused by turbulence resulting from abrupt changes in shape of the duct 10 or the like. The compression wave generated in 12 acts as an elastic piston in passing through the section 14 and drives the fluid in section 16 creating a pressure wave which travels to the end of said section and reflects off the end wall 18. The reflected wave then travels back up the section 16 and if the frequency of operation of the piston is correct, said reflected wave will arrive at the reducting section 14 at a time to be reversed in direction and have part of the energy of the next compression wave generated in 12 by said piston transferred thereto. When wave timing or generation in the section 12 is correct, (i.e. the amplitude and frequency of the piston 20 are right) the effect will be augmentive and energy will be added to the wave motion in section 16 in a cumulative manner until a shock wave phenomena develops therein and travels up and down the tube 16. This shock wave may be made to oscillate at relatively high frequencies (in the order of 50 to 200 times per second or more) the repeated intermittent compression effects of the wave on fluids or solids already in section 16 or injected therein intermittently may be used to change the physical and/or chemical characteristics of said fluids.

FIGS. 1a and 1b show further details of the construction and auxiliary apparatus associated with the wave resonating apparatus of FIGS. 1 and 2. The duct sections 12 and 16 are illustrated as lengths of heavy walled cylindrical pipe having end flanges 13a, 13b, 17a and 17b integrally formed or welded thereon. The tubes are preferably made of a steel, titanium or other alloy of high strength and not easily corroded by heat and the expected chemicals participating in or resulting from said reaction and capable of withstanding the eroding effects of said shock waves. High nickel steels such as Inconnel or Hastelloy-X, or suitable titanium may be used to make the shock tube sections 12, 14 and 16 or may line tubes of which said sections are cast or forged. Glass, glass-ceramics, or ceramic materials may also be used as the material of said sections or coated on the interior of ducts of the shapes illustrated. Bolts 26 may be used to hold the three illustrated sections together by clampingly engaging the flanges. Sealing gaskets or metallic O-rings are provided in circumscribing channels in the flanges to effect pressure seals thereacross. The construction permits rapid assembly and disassembly of the duct 10, for cleaning and inspection purposes.

Mounting brackets 27a, 27b and 27c are bolted to the flanges for rigidly mounting said duct on a frame or floor. Fluid piping 19 is provided as a coil about the working end of chamber 16 for removing heat generated in said reaction zone by the shock waves and/or the chemical reaction by circulation of a coolant therethrough. The coil 19 may also be used to heat the chamber walls if necessary to enhance the reaction. Bolted to the end flange 17b of section 16 is an end wall section 18 which may also contain means for removal of heat to conducted thereto by said shock waves reflecting thereoff. A removal insert 25 is secured to the wall member 18 having a diameter area equal to that of the cross section of chamber 16. The insert may be made of a high erosion and heat corrision resistant metal alloy, ceramic, ceramet or ceramic glass. It is held in a cavity in the wall 18 upon assembly of 18 with the flange 17b or by the use of screw fasteners or the like (not shown) and is removable for replacement, if necessary. Insert 25 preferably is greater in area than the internal cross sectional area of tube 16 and is engaged by the metal seal 29 between the end wall 18 and the flange 17b as illustrated. For certain applications, tungsten carbide or the like may be used for insert 25. Said insert 25 is shown in FIG. 1c as being cup-shaped on the side facing the tube 16 with a wall 25' having a bore the inside diameter of the chamber section 16. The interior surface of rim or wall 25' thereof receives high intensity forces of the waves reflecting off the surface of the base section 25" directly in line with said waves and prevent wear-out of the rear end of the wall of tube 16.

FIG. 1b shows the reducing section 14 as having a more elongated shape than that illustrated in FIG. 1a. The exact shape employed will depend on the other parameters of the equipment and fluid used therein. FIG. 1b also illustrates a modification to the end of the reduced diameter chamber portion 16 with a valve 31 located directly in alignment with the reaction volume 16' and secured to the end flange 17b thereof and operative for the longitudinal injection and/or removal of reaction material or products of reaction. The valve 31 is preferably program controlled to operate intermittently for a predetermined period during each reaction cycle and if properly operated may be used to inject a fluid or remove same so as to have an augmenting effect on the waves generated in the chamber rather than a detrimental effect.

Mounting details of the side located valves 40 and 42 are also illustrated and include base plugs or plates 40a welded to the wall of the tube section 16 having threaded holes therein to which the fittings 40' of the valves are secured.

In FIG. 1d, means is shown for oscillating a piston 33 at high frequency. A lineal drive 23 is secured in a section 12a of tubing which is provided with a flange and is bolted to the end flange 13a of section 12. The motor 23 may be a push-pull solenoid adapted for operation of a shaft 26 (connected to the piston 20) at high frequency by conventional means. The amplitude may range from a fraction of an inch to an inch or more.

FIGS. 12d and 12e show two other wave generating means for creating pressure perturbances in the section 12 of the shock tube 10 which may be amplified to shock waves further down said tube. In FIG. 1d a lineal motor such as a solenoid 23 or other electromagnetically driven transducer is coupled to a plate or diaphragm 33 supported near its perimeter upon assembly of sections 12 and 12b of the duct 10. The plate or diaphragm 33 is preferably a thin disc and may correspond to a modified vibrating diaphragm of a loudspeaker. The dotted outline 33' shows the possible position of 33 (exaggerated) during the forward stroke in which it creates a pressure wave in section 12. The shaft of 23 is secured to 33 by a fitting 33" welded or bonded to the rear face of 33.

In FIG. 1e is shown another means of generating pressure perturbances in the primary chamber 12 of the type described utilizing a horn 35 having a turbine blade arrangement or vibrating element therein operating a high frequency and operative to produce high frequency waves. The horn 35 may itself create shock waves of low intensity in front of its cone 37 which extends completely across the chamber 12 and is held between the sections 12 and 12b when assembled as shown.

Several modes of operation of the apparatus of FIG. 1 are noted viz:

(1) The entire internal reaction zone may be pressurized. Gas pressures of several atmospheres or higher may be provided in the chamber 12 by, for example, combustion of one or more of the gases introduced into said chamber. Such combustion may be effected by an igniter such as a spark plug (not shown) operating at predetermined intervals and preferably synchronized to occur with the formation of shock waves in the zone 16c. Combustion may also be effected by the shock waves formed in zone 16c and it may be part of the chemical process occuring in said zone. Pressurization may also be effected by introducing a fluid under pressure through any of the illustrated inlet valves. Said pressurization may be effected, at the beginning of a working cycle, during the working cycle at predetermined time intervals thereof or at specific times in the working cycle in synchronization with the wave motion in tube section 12c to augment said wave motion and increase the intensity of the shock waves generated in zone 16c. Pressurization of the entire internal volume of the chamber 10 may be effected by introducing fluid through one of the valves 32 or 34 and may be maintained at a predetermined average value by automatic control means such as by opening said inlet valve for a predetermined period of time during each cycle using constant fluid pressure applied to driver or working fluid.

(2) The chamber 10 may be operated by cyclic and rapid reduction of the pressure in the zone 16c by opening the exhaust valve 42 at a known time in the cycle for a predetermined interval while applying suction to the line 38 to enhance the intensity of the shock waves generated in said section. This may be effected as the result of withdrawing part of the fluid which took part in the reaction resulting from the prior shock wave generated therein. Connection of a vacuum pump or decompression chamber to the other end of 38 will effect such action when 42 is opened.

(3) In a third mode of operation, the inlet lines 28 and 30 may be utilized to maintain a supply of driver fluid in section 12c by operation of the valves 32 and 34 in synchronization with the wave motion in the chamber after each or a predetermined number of cycles. The drive fluid may also be provided so as to take part in the reaction occuring in reaction chamber section 16c. Fluid line 36 may also be connected to a reservoir of a reaction fluid under high pressure and line 38 to a chamber under vacuum. Thus when the valve 40 is opened for a short interval such as a fraction of a second, a predetermined quantity of fluid from the supply reservoir will flow into zone 16c. If valve 42 is opened simultaneously with the opening of valve 40 or shortly thereafter, the fluid entering said chamber through valve 40 may be used to help purge part of the reactant fluid already in the reaction region thereof and cause it to flow into the exhaust line 38. If both valves are opened for a brief period during each wave cycle, such as after the shock wave has passed through region 16c and reflected off the end wall 18 or at least has caused a predetermined reaction to take place, fluid flow into and out of the section 16c may be thus timed so as not to reduce the resonant wave motion therein. Thus precise timing is required in the opening and closing of the valves 40 and 42 and this may be effected by automatic control or programming means operative to predeterminedly effect the means driving the piston 20, spark generation, operation of the driver turbine, or other means and valve operation.

FIG. 2 shows shock wave generating apparatus similar to that shown in FIG. 1 but having spark generating means utilizable per se or with a piston for creating and/or augmenting or increasing the intensity of waves generated by the motion of a piston 46 in an enclosed elongated duct 44. The shock tube 44 may be constant in internal cross section along its entire length or similar to that shown in FIG. 1. It may also have an internal cross section or bore the shape of the frustrum of an elongated cone, which extends from a cylindrical section 12' in which piston 46 is oscillated. At the end of section 12' in the tapered section 14' or therebeyond in section 16', is shown situated a pair of electrodes 62 and 64 across the walls of the tube. The electrodes are connected in an electrical circuit 72 with a suitable source 90 of high voltage current such as an induction spark coil or banks of condensers and a means for discharging said current across the electrodes at a predetermined time in the transient pressure cycle such that the shock wave created by said spark will be additive in action and augment or increase the intensity of the pressure or shock wave created in section 16' by the motion of the piston 46. In FIG. 2 a pair of ignition points 86 are urged to close at a predetermined point in the operating cycle by a cam 84 secured to the shaft 80 of the motor or drive causing motion of the piston 46. By adjustment of the position of the cam 84 on the shaft 80 or by other synchronizing means, the points 86 may be made to close at a precise time in the pressure cycle (i.e. point in the motion of the picton 46 which operates in phase with said fluid movement cycle in the duct 44.

Shock wave generation and/or augmentation utilizing sparks arcing between electrodes may also be provided in other locations in the apparatus of FIG. 2. For example, a pair of electrodes may be provided projecting from the face of piston 46, or on the end wall 18 to coact with the augmenting action of electrodes 62 and 64 or to be used per se. When provided on the face of piston 46, the spark may be arced during the forward or compression stroke of said piston at a time to augment the pressure wave generated in chamber section 12 and hence increase the compression effect on the fluid in section 16. When provided on the face of piston, as illustrated hereafter, the spark is generated immediately after the reflection of the shock wave thereof so as to augment the reflected wave. Electrodes may also be provided across or within the chamber sections 12 and 14 and may be operated per se or in coaction with said piston 46 and/or other pairs of electrodes. Thus a tube configuration as illustrated in FIGS. 1 to 2 may be provided with spark arcing means per se in the chambers 12 and 16 together with means for generating and timing said sparks to create a shock wave motion in the chamber section 12 at a predetermined frequency driving fluid in chamber section 16 as does the piston of FIG. 1, and may be used per se or in coaction with spark arcing means in section 14.

Further details of the apparatus of FIG. 2 comprises means for driving the piston 46 which includes a connecting rod 76 pivotally mounted on a wrist pin 47 on piston 46 and connected at the other end to a crankshaft 80 with a cam type of counterbalance 78. The shaft 80 is rotated by a motor (not shown) at a constant speed. Notation 82 refers to a crank case secured to tube 44 for supporting and housing the crankshaft 80.

A second piston 48 is illustrated as being slidably engaged in the end of tube section 16 and may serve either or both of two purposes, (a) to coact with the action of piston 46 and/or the sparking means in augmenting said wave action by imparting energy to the fluid in motion in section 16. It may also be used as a valve if fitted with a sub-piston to admit and/or remove fluid from chamber 16. By axial adjustment of the position of piston 48, it may be used as a movable end wall to vary the length of section 16 with (a) temperature changes in the chamber (b) with fluid chamber or variations in the characteristics of fluids as reactions progress therein or when different fluids are injected or introduced therein as the process progressed all of which would ordinarily change the speed of the propagation of sound in the chamber 44. Notation 60 refers to a sliding seal and bearing support for the shaft 50 of the piston 48. This piston 48 may also have the design shown in FIG. 18 for admitting and/or removing fluid from the reaction zone 16.

In the operation of the described apparatus gas pressures of several atmospheres or higher may be provided in the described shock tubes by combustion of one or more of the gases introduced into said chamber through one of the illustrated valves. Pressurization may also be effected by introducing a fluid under the desired pressure through any of the illustrated inlet valves.

FIGS. 3 to 5 show details of reaction apparatus of the type illustrated in FIG. 1 which may also be modified as in FIG. 2, comprising a multiple array of shock tubes which are driven by a common drive means. Multiple shock tubes 100a to 100k of the intermittent type illustrated in FIG. 1 and/or FIG. 2 are provided in a circular array with the ends of the reaction zone sections 101 of each tube communicating with a circular duct 128 into which a working fluid is pumped and held or circulated while the shock waves generated in said tubes react thereon.

Each of the reaction chambers 100 of the multiple shock tubes, for example, may be closed off and provided with means for acting on the same or different fluids introduced into each chamber continuously or intermittently by valving means connected thereto or through the piston-end of the tubes, by means described hereafter. The open ends of the tubes of the assembly of FIGS. 3 to 5 may also be extended into a single container or chamber having a fluid to be reacted on by the shock waves generated therein. Said fluid may be a liquid and the ends of said tubes may be projected just above or below the surface of said liquid.

The reaction tubes 100a to 100k are shown each supported at one end by a plate or frame 104 which is bolted to the floor or frame 105 on brackets 104 and at the other end by a second plate 130 supported by brackets 109. Details of the mounting of the head end 100' of each tube are illustrated in the cross-sectional view, FIG. 3 which shows a flare 102 welded to the end of said tube 100 which is bolted to the vertical plate 104, there being a hole 111 in the plate in line with the longitudinal axis of each reaction tube through which the piston rod 107 passes. In FIG. 5, the hole 111 is fitted with a slide bearing 112 for guiding the piston rod in axial movement therein. A large disc 118 is provided as a cam unit for driving the pistons 106 of all reaction tubes as said disc 118 rotates. The disc, preferably made of metal, is mounted on a shaft 122 which is supported on end bearings 123 and 125 secured to the floor or frame 105. The shaft 122 is driven through a reduction gear drive unit 124 by a motor 126. The periphery of the disc 118 is a cylindrical surface 118' having a cam way provided therein in the form of a closed loop channel 120 of a smooth wave-like contour preferably in the form of a flat sinusoidal curve, as illustrated. In FIG. 5, a ring 119 is fitted over and secured to the periphery of the wheel and partly closes off the sinusoidal channel 120. An arm rod 114 formed on or welded to the end of the piston rod 107 projects into the channel 120. A roller bearing or bearing supported wheel 116 is rotationally mounted on the rod or shaft 114 and rides on one of the side walls of the groove 120 depending on which part of the closed loop curve of said groove is opposite said piston. As the disc 118 rotates on its shaft, the cam shaped channel 120 will trace a reciprocating path in any plane passing through and containing the axis of the shaft of the disc. The wheel 116 will thus be carried in an oscillating motion in the groove 120 as the disc rotates and will urge the piston 106 to oscillate a multiple number of times each time said disc rotates depending on the number of loops to the curved channel. If there are 8 cycles or loops to the channel 120 on the cam periphery, then each piston 106 coupled thereto as illustrated will oscillate 8 times for each rotation of said cam disc 118. If the cam disc 118 is driven at 1,000 r.p.m. then each piston will oscillate 8,000 times per minute.

Connected to the ends of each reaction tube is a circular duct 128 which communicates with each tube. A fluid pumped through said duct is thus subjected to shock waves at the points in its travel where each of the tube ends 101 connects thereto. A stream length of fluid in circulating through duct 128 from inlet line 132 to exhaust line 133 is thus subjected to the heat and pressure of shock waves of each of the shock tubes 100a to 100k.

In FIG. 5 the notation 112 refers to an inlet line to chamber 101' for the admission of a fluid thereto and/or a lubricating fluid for lubricating the piston 109 in its traverse motion in the tube section 100'. 122' refers to a hole or line provided in or attached to the flywheel 118 for ducting a lubricating fluid to the channel 120 for lubricating the surfaces of the channel to reduce friction and wear as the piston is moved back and forth by the urging of the wheel 116. Oil may be vented through multiple lines 122' from the shaft 122 by pumping said oil through a hole in said shaft communicating with the line or ducts 122'.

Additional design features illustrated in FIGS. 3 to 5 include radial holes 122' provided through the cam disc 118 from near the shaft mount or bearing near the center of said cam wheel for conducting a lubricating oil to the channel 120 for improving the operation of urging the cam rod or wheel 116 engaged therein and reducing wear on the walls of said sinusoidal cam channel. Oil may be pumped through the shaft 122 and thence through multiple ducts or passages 122' provided in the disc 118 or through tubing secured to the disc. In FIG. 5, a fluid line 112 is shown terminating at the head end of the chamber. Said line may be used to provide lubricant for lubricating the piston and cylinder. A similar line may be used to introduce a driver or working fluid to the chamber 101 (12c) by introducing it into the volume 100c' between the bottom of the piston 106 and the cover plate 104 whereafter said fluid may be introduced into the chamber 101 downstream of the piston by valving in said piston to be described.

FIG. 6 illustrates schematically, apparatus for controlling the aforedescribed wave generating means whereby timing of such functions as fluid injection, reaction product exhausting, spark generation, etc. is effected by directly coupling timing means to a drive shaft utilized to drive said piston 106. In FIG. 6, an adjustable speed, constant speed motor 126 drives shaft 122 through gear box 124. Coupled to shaft 122 is the cam wheel 118 of FIG. 3 which, as it rotates, causes piston 106' to oscillate back and forth a predetermined stroke in tube 100. The piston 106' is assumed to be the valving type illustrated in FIG. 14 or 15 and a chamber 322 is provided in ducting 100 for holding a quantity of fluid to be injected through 106' in the expansion or return stroke of said piston. It is noted that one or more of the valving or sparking means to be described may be modified or eliminated as described, from the apparatus of FIG. 6 depending on the desired mode of operation thereof.

Control of timing of the opening and closing of the inlet and exhaust valves 164 and 168 to working chamber 100b is effected through shafting geared to the shaft 122 or gear drive 124. A shaft 140 is geared to shaft 122, a second shaft 142 is coupled to 140 via gears 141. This shaft 142 extends to a variably adjustable speed drive 146, such as a V-belt device, having an output shaft 144 extending to an inlet valve 164 which is preferably the type illustrated in FIGS. 7 and 8. Thus as main drive shaft 122 rotates, the valve drive shaft 144 rotates, and can be made adjustable by adjusting drive 146 to rotate once, twice or any desired number of times while the piston oscillates once. Shaft 122 may also be made to rotate once for any predetermined number of oscillations of said piston. The latter operation (i.e. one valve rotation or operation per number of perturbances or shock wave generations will permit the working fluid, or solid in 100b, to be subjected to shock waves for a prolonged period of time.

Once the variable drive 146 has been set and locked at a predetermined value, phasing of the rotation of valve with the motion of piston 106 may be effected by use of a non-slip friction clutch between any segments of said take off shafts or by an angularly adjustable shaft coupling in any shaft such as 142' in shaft 142. Angular adjustment or phasing of the operation of 164 with the motion of the piston may be effected by the provision of graduations or marks on said shafts 142a and 142b and stationary alignment pointers adjacent to each. By manually rotating one shaft section relative to the other and noting the position of the marker line on shaft relative to a stationary marker, then locking or coupling the shafts 142 and 142b together at a predetermined position relative to shaft 122, the desired timing of the operation of 164 relative to the position of the piston 106 may be effected.

In means similar to that just described, the rotary exhaust valve 168 or any other valve used for the admission or exhausting of products from chamber 100b may be coupled to the main drive and timed to operate in a predetermined synchronization with the motion of the piston 106'.

Also illustrated in FIG. 6 are means for timing a spark to be generated at or across the section 100b to occur at a predetermined time in the wave generating cycle in accordance with the teachings of FIG. 2. A shaft 150 is geared to shaft 143' which is coupled via gears 141' to shaft 140' geared to the main shaft 122. The shaft 150 extends to another shaft 153 via a coupling 152. The coupling 152 like 142' is adjustable in angle so that shafts 150 and 153 may be adjusted in relative angle to each other. A cam 154 on the output shafts 153 is adapted to open and close a switch 156 or contactors which, when actuated, complete a circuit as illustrated and described and cause a spark to jump across electrodes 160 and 161 by discharging condensers or energizing a spark 160 and 161 by discharging condensers or energizing a spark-coil 158. Thus said spark may be made to occur at any time during a pressure cycle by varying the relative position of shaft segments 150 and 153 or by adjusting the angular position of the cam 154 on its shaft. A variable speed drive or changeable gear box 152' provided in shaft 150 may be used to create more than one spark per cycle by stepping up the rotation of shaft 153 a desired degree. Stepping down said gear or shaft ratio will provide one spark produced shock wave per number of pressure wave generations caused by motion of the piston 106'.

Further details of the apparatus of FIG. 6 include an inlet duct 162 to valve 164 and an adjustable valve 178 for adjusting the amount of flow from a pressurized reservoir (not shown) to chamber 100b, a second adjustable valve 172 for regulating the degree of suction in exhaust line 166, a vacuum pump 176 connected to 166 through valve 172.

If the mode of operation of the apparatus of FIG. 6 includes the use of a neutral driver fluid such as helium in which said shock waves are generated, and said injected working fluid is a gas whereby a fluid gas or vapor is removed during operation, then some of said driver gas will also be removed and will have to be replaced. Also illustrated in FIG. 1 is a pressurized reservoir 188 of said driver fluid ducted through a line 192 to the chamber 322 before the piston 106' through an adjustable valve 194. If driver fluid is passed out with the products of reaction, the total exhaust products may be passed through a separator 177 prior to passage to a storage tank 184 wherein the driver fluid is separated therefrom. It may be further processed and returned or recycled through the reservoir 188 via ducting 182. In FIG. 6, the numeral 148 refers to a variable speed driver similar to 146 and 194 to a regulator or a valve for the valving of driver or working fluid or explosive fuel to the chamber 322. It is noted that the various valves of FIG. 6 may be solenoid operated and controlled to open and close by means of electrical contactors such as 156 synchronized to close and open at a specific point(s) in the rotation of the shaft driving the piston 106'.

FIGS. 7 and 8 show details of a rotating valve utilized for the admission of fluid to the reaction chamber and/or reaction product removal from the reaction chamber described. The valve 204 may be coupled in an inlet or exhaust line leading to or from the chamber 100b or it may be fastened to the wall of the chamber 100a or the end wall 100c of the reduced section 100b. In the latter position, in line with the central or longitudinal axis of the shock tube 100, the valve 204 may be operated so as to permit all or part of the shock wave generated in the closed tube to travel therethrough to another chamber, to admit and/or exhaust gas from said chamber for predeterminedly affecting wave motion or the reaction, or for removing part of the products of reaction therefrom.

The valve 204 has a body 204' made of a rectangular block of metal having two passageways bored therein. A first bore 206 is provided through said block for passing a fluid through said valve. A second passageway 204 is provided perpendicular to hole 206. Plates 204a and 204b are secured in sealing engagement with the surfaces of the block 204' across which the hole 207 is bored. A cylindrical gate 208, is slidably mounted in the bore 207 on shaftpins 210 and 210'. A bore 209 the diameter of the bore 206 is provided through cylinder 208 to align with said hole 206 when the cylinder 208 is mounted as shown. Thus rotation of the cylinder or rod 208 alternately covers and opens the bore through the valve body 204. A gear 214 secured to the end of one of the shafts 210 is engaged by another gear 214' extending from a motor driven shaft 211 coupled to motor 212.

The shaft 211 may be the shaft of the motor driving the piston 106 or may be coupled thereto. It may also be coupled to the shaft of a motor synchronized in its operation to the rotation of the motor driving said piston so that the valve 204 may be operative to admit and/or remove fluid from the shock tube 100b predeterminately during each pressure cycle. The motor driving shaft 210 may also be a stepping motor operative to intermittently open and close said valve by rotating it 90 degrees at a time. The rotational positioning of the cylinder 208 may also be made to occur once during every predetermined number of pressure wave cycles or at a predetermined time interval, after the starting of said reaction apparatus after a known reaction has occurred so as to remove reaction products from the shock tube and/or add new fluid thereto. Synchronization of the motor 212 driving the valve gate 208 with the rotation of the motor driving the piston 106 may be effected by providing both said motors as synchronous motors operated by a common alternating current power line. By providing an adjustable phase shifter between said power line and one of said motors any adjustable operation of one of said motors with the other motor may be effected so as to predetermine the instants or the opening and closing of valve 204 relative to the transient pressure cycle in the shock tube 100. By controlling the pressure upstream of the valve 204 as well as the concentration of gas, gases or other fluids passed therethrough, optimum operating parameters may be attained.

FIG. 9 shows details of a fluid pressure operated valve operative for the admittance of a working or driving fluid to any of the described reaction apparatus regions. The valve 220 is opened by the fluid to be admitted at a predetermined pressure and closed by the action of a spring. It may be applied where a fluid under intermittent pressure is available, or may utilize the fluctuations in the reaction chamber pressures caused by the internal wave motion so as to admit fluid thereto at a specific instant in a wave cycle.

The valve 220 comprises a body 222 including an assembly of a cap member 223, a plug 224 and a base ring 225. The latter 224 has holes therein for fluid flow to the interior or the reaction chamber from holes 228 when a piston member 230 compresses a spring 232' and moves thereagainst unseating a shelf section 231 which normally covers the holes 228 which communicate with the inlet line 226. Thus fluid in said feed line 226 forces open said valve when the pressure differential across the piston 230 overcomes the force of the spring 232' and said fluid is delivered to the chamber.

The FIG. 10', the line 226 of FIG. 9 contains a driver fluid which, when its pressure becomes great enough, pushes piston 230 against spring 232' unseating shelf 231 and permitting an inlet hole 240 to communicate said chamber with a second inlet line 241 containing a fluid desired to be flowed into said chamber 16c. The driver fluid pressure may be obtained from a source of controllable or intermittent pressure which is synchronized in pressure variation to the variations in pressure in the duct 16. The line 226 may also be a bleed line connected to another part of the reaction chamber or shock tube at a location so as to provide the desired valve opening at the desired time in a cycle.

FIGS. 10 to 18 show details of automatically operated valves for the admission or injection of fluids into the shock tube chambers provided herein and/or the automatic removal of reaction products therefrom.

In FIG. 10, a valve 221 is provided which is opened for permitting flow of a fluid therethrough from an inlet line 227 by pressure bled from one of the chambers of the shock tube illustrated. In the embodiment of FIG. 10, fluid, under pressure, is preferably bled from near the head-end of chamber section 16 through line 227 which fluid reacts on one face 230 of a piston 231 forcing it against a spring 232 which operates to normally keep said piston flush against a face 222 of the valve, preventing flow from inlet line 241, thereby opening said valve. Ports 240 extending from the inlet line communicate with the inter-volume 16c of the duct 16 when the shelf 231 of the shaped piston or plunger 231 moves from its seat against surface 222. The coil spring 232, is compressively engaged in a hole 232' provided partly through the piston section 231 and is held at its other end by a rod extension 237 of a mount 238 which threads into the valve body as illustrated.

It it is desired to introduce a working or driver fluid to the chamber 16c by the pressure of said fluid alone rather than by the bleed actuated means illustrated, said fluid may be provided under a constant or pulsating pressurization from a pump through the line 227, at a sufficient pressure to move said piston 231 against the closing action of the spring 232 whereupon a by-pass duct (shown as a pair of dotted lines communicating between said inlet duct 227 and the chamber 16c when 231' is unseated and normally covered by the latter) is used to provide fluid from 227 to chamber 16c. If the line 227 is pressure pulsed, the piston will return when the pressure drops seating section 231' against surface 222 and closing off 240.

The spring seat member 234 is secured to the insert through a yoke 238' extending across the insert 224. The fluid passed through the valve 221 flows through openings 236 between the yoke mount 238 and the insert wall 224'.

If the pressure against 230 is constant but just enough to open the valve, the increase in pressure within 16c during the operating cycle may be used to close the valve and the piston motion will automatically be synchronized to the pressure cycle.

Another type of inlet valve is illustrated in FIG. 10' and comprises in its simplest form, a flat spring 242 cantilever mounted over an opening 243 in the wall 244 of duct 10 with a fluid inlet line 245 connected to the duct at the opening. This is a well-known reed valve and the pressure required to open it depends on its dimensions and spring characteristics when mounted. Sufficient pressure within the inlet line 245 will move reed off its closed seating position permitting fluid to enter chamber. The fluid may be pressure pulsed against 242 or provided at constant pressure with the internal pressure variations accounting for opening and closing of the valve.

FIG. 11 shows details of a typical valve for the admission of fuel or driver gas to the smoothly contoured chamber 251 of any of the wave generating apparatus described, or for exhausting the resulting products of reaction therefrom. A valve head 250 is integrally formed on the end of a stem 252 which is slidably supported in a bearing 253 secured to the walls 246 of an enclosed cup-shaped housing 247. A compression coil spring 257, engaged between the top 258 of housing, engages a shelf 254 integrally formed on the stem 252, and urges the head 250 against the walls of a tapered hole H in the chamber wall 251. The face 250' of the valve head 250 has a radius of curvature equal to the inside radius of the chamber wall 251 so that when said valve is seated flush with said wall 251, the latter will be free of irregularities thereby providing a smooth interior surface for optimum efficiency during the generation of the shock wave phenomenon in the duct. A maximum efficiency is attained.

The valve may be opened by one of several means including a cam rotated by a shaft gear or synchronized to the shaft driving the piston 20 creating the wave motion. Another method of synchronizing the operation of valve 245 to the wave motion is to open said valve by a pull-solenoid which is coupled to stem 252 and mounted on the top of chamber 246. The solenoid may be actuated by a photo-relay, pressure switch or limit switch in circuit with a power supply and said solenoid, which is energized at a point in the piston travel as described.

The numeral 255 refers to a fluid inlet line communicating through hole 256' with the chamber 256 by use of fitting secured to hole in wall 246' which holds fluid to be admitted through said valve when 250 is lifted off its seat.

FIGS. 12 and 13 are sectional views showing details of a multiple inlet and outlet valving device 260 applicable to apparatus of the type described. A body or housing 262 is provided to which are secured multiple ducts 264 to 268. The ends of the housing 262 are flared permitting the device to be bolted to a duct 276 which may be the end of a tube such as the section 16 of FIG. 1 or tube 48 of FIG. 2. The duct 276 may also be an inlet pipe for admitting a fluid or fluids to the interior of the fitting 260. Secured to the housing 262 are shown three tubes 264, 266 and 268 of essentially the same diameter, the axes of which are preferably in the same plane and are essentially perpendicular to the axis of the duct 278. The tubes 264 to 268 communicate with the interior of the valve 260 through holes 280 in the wall with which they are aligned, when three holes 281 of a walled cylinder 272 are aligned with the holes 280 in the body 262. The cylinder 262 is open at one end 263 and closed at the other by a plate 284 welded to its other end. Centrally secured to or formed integrally with the endplate 284 is a shaft 286 which is rotationally mounted in a bearing and shaft seal 288 secured to a plate 289 covering the end of casing 262. The shaft 286 may be stepped or rotated by a solenoid mechanism or motor at any predetermined rate or speed to alternately permit the tubes 264 to 268 to communicate with the interior of the cylinder 272. Thus when the cylinder 272 is aligned with its holes 281 aligned with the holes 280 in the casing, a smooth and uninterrupted flow of fluid from tubes 264 to the inner volume 282 of cylinder 272 if all holes 280, 281 and the bore of said tubes 264 to 268 are the same diameter. Notations 287 and 287s refer to ball bearings and seals secured between the outer wall of 272 and the inner wall of 262 to facilitate rotation of 262 and seal of the interior of said fixture or valve.

Another line or pipe 270 of smaller diameter than the others is shown secured to the casing 262 in an angular position whereby it will communicate with the volume 282 when the other ducts 264 to 268 are shut off from said interior as a result of the rotation of the cylinder 272.

The device of FIGS. 12 and 13 may be utilized with the described apparatus in one of several manners:

(a) Said valve 260 may be fitted on the end section 278 of a shock tube as illustrated. The three tubes 264 to 268 may be used to conduct three fluids of different chemical composition to the chamber 282 to be mixed and subjected to shock waves generated in 278 and reflected off the back plate.

(b) The three tubes 264 to 268 may also be the end sections of shock tubes utilizing the same or different fluids as the tube 278. The fourth duct 270 may be used to inject a working fluid into the chamber 282 and/or remove products therefrom during or at the end of shock wave generation therein.

(c) If shock waves are produced in the three tubes 264, 266 and 268 as well as the main shock tube 278 to which they are coupled by means of the valve, the valve may be utilized to close off the chamber 282 to the chambers 264 to 268 while a fluid to be worked on is injected through 270, or the three tubes 264, 266 and 268 may be used to introduce quantities of different fluids simultaneously into zone 282 while 270 may be an exhaust line for the reaction products.

(d) The valve 260 may be used to close off two of the three ducts 264 to 268 while the third is open to 282 thereby permitting a single shock wave to collapse on the fluid at a time and, at the same time, permitting new waves to be generated in the other two tubes which are closed off until a single opening 281 in 272 passes their respective port. If resonance is employed in 264 to 268 to create shock waves, this will permit any disruptive effects caused by the opening of the valve to be corrected.

FIG. 14 shows still another variation in the described means for admitting or valving a fluid to the interior of the reaction apparatus of the type described. In FIG. 14 a piston 290 which may be similar in operation to piston 20 of FIG. 1, may operate in the working zone of FIG. 2 as does 20 or may be oscillated on the end of shaft 22 in any of the other illustrated fluid inlet or exhaust lines. The center of piston 290 has a longitudinal bore 296 which extends partly through the shaft 294 to a point where a radial bore 297 communicates 296 with the exterior of said shaft. An injection nozzle 292 is preferably threaded and adapted to be secured in the counter bored and threaded end of the bore, and is shown flush with the face of the piston.

A bearing assembly 298 provides means for communicating a fluid with the bore 296 as the piston 290 oscillates relative thereto in a part of the reaction chamber or inlet line. The bearing 298 has a volume adjacent the radial bore of sufficient longitudinal extension to always communicate with said bore regardless of the stroke position of said piston, although it may be limited in length and positioned only to communicate therewith at a point in said stroke when fluid delivery is desired. The volume 300 which is formed by undercutting or providing a cavity in the inside surface of said bearing, communicated with an inlet tube 301 through a hole 302 in said bearing wall. Thus fluid introduced into volume 300 through tube 301 flows through bore 296 and to the nozzle 292 through which it may be injected into the volume beyond the piston. The numerals 304 and 304' refer to sliding shaft seals supported by the housing 298 and adapted to engage the shaft 294 and seal off the chamber 300 as shaft 294 oscillates.

FIGS. 15 and 16 show details of a modified reaction chamber design including a modification in the design of a wall or surface positioned in the path of intermittently appearing shock waves and shaped to more efficiently utilize said waves in reaction kinetics of the type described involving fluids. When a shock wave travels into a container, duct or volume of increasing cross section it increases in intensity. By providing the end wall 332 of a shock duct 330 or chamber wall with multiple indentations 334 of decreasing cross section with depth, the pressure and temperature effects on a fluid in said indentations will be increased or amplified, due to the facts that the shock waves are increased in value after they enter said volumes 334 and the fluid is confined from lateral flow to a greater degree than if said indentations were not provided. The efficiency of certain reactions will thus be improved.

In FIGS. 15 and 16, the relatively heavy end-wall section 332 is provided with a series of parallelly extending V-shaped channels 334 through which a liquid or other fluid is flowed from an inlet duct 336 at one side of the chamber 330 to a removal duct 338 at the other. It is assumed that the supply reservoir 336 is pressurized or provided with a pump (not shown) and/or valve which may intermittently or continuously flow fluid through the V-channels 334 in 332. For example, said fluid 337 may be filled to a specific height in each channel 334 by influx through the openings 335 in the sidewall 332', thence subjected to a predetermined number of shock waves until a specified reaction has taken place and thereafter removed from said channels during the operation of the shock tube or after the wave generating means has been stopped.

The channels 334 may be other than wedge-shaped in cross section. Said indentations 334 may be replaced by cone, semi-spherical or other shaped cavities which may be partially filled and emptied by gravity means (by tipping or dumping the tube 330) or through ducts leading to an interconnecting said cavities through the block or wall 332 with supply and drainage or suction systems. The numeral 339 refers to holes in the wall 332 through which products of reaction are removed by gravity or suction means to ducting 340'. Numeral 340 refers to a feed line for supplying fluid to reservoir or inlet duct 336.

Several methods of controlling the valving and other mentioned intermittent operating devices are illustrated in FIGS. 17 to 19.

In FIG. 17, the piston 20 oscillating in the primary chamber 12 is driven by a motor through a cam 118. Affixed to the shaft 22 of piston 20 is an arm 115 which extends outwardly therefrom. Secured to the arm 115 is an elongated rod 343, which moves in a slide bearing 343' as the piston 20 moves back and forth. A pin 344a secured the other end of rod 343, rides in a slot in the end of a crank arm 344 which is pivotally mounted on the casing of a valve 40'. When the crank is urged to pivot by the action of arm 343, rod 343 operates to open and close the valve 40' which connects a line 28' extending from a pressurized source of fluid to be injected into the chamber 20 and said chamber. Thus, at a predetermined location during the stroke of the piston 20, fluid will be injected into chamber 20. The coupling between the shaft extension 115 and rod 343 is adjustable so that the timing of the operation of valve 40' may be adjusted to attain an optimum mode of operation. A collar 115' is welded to the end of rod 115 to slidably engage said rod 343. The end 343b of the rod 343 is threaded. By adjusting a pair of locking nuts 343c and 343d, the location of the piston 20 at which valve 40' opens and the degree of valve opening may thus be adjusted.

FIG. 18 shows details of a piston operated valving device for use in the apparatus described to admit and-/or remove fluid material to the described shock tubes, their main chambers, working zones and/or described sub-chambers connected thereto. The valving piston 350 of FIG. 18 may be used, for example, as the working piston 20 of FIG. 1 or as the working chamber end wall or valve 48 shown in FIG. 2. The piston 350 may also be used in any of the inlet or exhaust lines 28, 30, 36 or 38 of FIG. 1 to valve fluid to one or more of the shock tube zones or remove reaction products therefrom. As such, the piston may be oscillated after a predetermined number of motions of the main piston 20 to introduce and/or remove a predetermined amount of fluid necessary to sustain the reaction and/or continue the process. The piston of FIG. 18 may also be oscillated to open and close once during each pressure cycle (i.e. once for each cycle of motion of the main piston or each pressure pulse in the shock tube resulting in the formation or amplification of a shock wave in the working section).

The piston-valve 350' of FIG. 18 comprises a cylindrical piston head 350 having one or more piston rings 351 assembled therewith and slidably engaged in the tube 12. The interior of the piston 350 has a bore 352 in which a sub-piston 353 is slidably engaged and is preferably sealed around its peripheral surface with rings 354. A shaft 355 of smaller diameter is integrally formed with the sub-piston 353 and is engaged in a slide bearing 112 secured in tube 12 by a plate 356 which engages and is held against the inside wall of tube 12. The shaft 355 may be driven by various means including a cam disc 118 if piston 350 is the main piston of the apparatus or a crank or other mechanism.

FIG. 19 shows details of another method of valve and piston timing or synchronization control which utilizes a photoelectric cell or the like for scanning marks on the piston shaft 107 to initiate valve actuation as well as effect other control functions such as spark generation. Notation 358 refers to a photoelectric relay including a photoelectric cell, amplifier and associated optical means including a slit permitting the scanning unit to line scan locating lines. The unit 358 is mounted on a bracket 354, supported by shock absorbers 355 secured to the wall 350 of the reaction chamber and positioned just above the end of piston shaft 107. A grating or grid 356 of black and white serves as locating marks which are painted, printed or otherwise provided on said shaft or on a sheet 357 of rigid material such as glass which is secured to said shaft 107 in a position whereby said lines will be individually scanned by the optical head 359 or slit associated with the photocell of the relay 358. Depending on the stroke of the piston 352, the spacing of the lines on the grid 356 will be a function of the degree of precision required in timing the operation of the wave-generating apparatus. FIG. 19' is a view in a plane perpendicular to the shaft 107 and shows use of a diffraction grating or high resolution grid for shaft location and timing. FIG. 19' shows a grating mounted on a plate 357' which is a sheet of glass secured to a flat section of shaft 107 and overhangs said shaft. The grid lines on 357' may be in the order of 500 to 5,000 lines per inch. To photoelectrically detect these lines, a slit light source 358' is also mounted on shock absorbers which are secured to the duct 350 or its support. The light source 360 is aligned to pass a thin line of light through one or more of the spacings between grid lines 357 which results in a pulse signal train being generated as the piston moves, which pulse train is passed to the adjustable predetermining counter 361 operative to emit a signal upon the receipt of a predetermined number of pulses from relay 358. The pulse output of counter 361 may be used to energize one or more devices 362 such as solenoids, solenoids for the described valves, or switches controlling spark discharge. It is noted that the grid on sheet 357 may be replaced by one or more marks or lines at predetermined points provided along the length of piston rod 107 at locations where it is required to effect one of the described cycle actions for predetermined operation without need for an adjustable controller such as a presettable predetermining counter.

Another means for timing the occurrence of the described auxiliary functions in the operation of an intermittent shock tube as described, is illustrated in FIG. 19a and may be employed to control such described actions as the opening and closing of inlet and exhaust valves to admit or remove fluid relative to any of the regions of the herein described apparatus, the regulation of flow of a fluid relative to the reaction chamber, the control of one or more of the described motors, or the timing of wave generating spark discharges to augment fluid flow or other operations which need be synchronized to the oscillating wave motion in the duct. In FIG. 19a an oscillating piston 352 is provided in a duct 350 arranged, for example, in apparatus such as illustrated in either FIG. 1 or FIG. 2 or elsewhere herein. An actuator comprising a rigid rod 366 is secured to the piston shaft 354 and is operative to close the contacts of a limit switch 370 when the piston 352 is at a predetermined point in its travel. Said switch 370 is mounted on the end wall of duct 350. The switch 370 is provided in series circuit with an electrical power supply 372 and an adjustable time delay relay 376 so that switch 370 may be closed at a selected point in the oscillating gas dynamics cycle occurring in the duct 350. When switch 370 is actuated by contact with actuator 368, a pulse is transmitted to delay relay 376. The output 377 of delay relay 376 may then be passed directly to device 362 to be controlled thereby or to one or more of the mentioned valve solenoids or servos. The actuator arm 368 is shown longitudinally adjustable on piston rod 366 permitting switch 370 to be adjustably closed.

FIG. 19c shows still another means for effecting timing and control in the operation of valves and the generation of sparks in apparatus to occur at a precise instant during each pressure or shock wave cycle occurring in one of the described shock tubes. In FIG. 19c timing is controlled and effected by the wave generated transient pressure.

A pressure sensitive gage 378 is mounted on the wall 350 of the shock duct 12 and recessed or shaped so as to offer minimum resistance to wave and fluid flow. A gage such as an electrical condenser transient pressure gage is employed which provides a change in output signal when the gas pressure on the face 378' of its probe or transducer element varies. The electrical output 378'' of the gage 378 is connected to an adjustable relay 379 which may be adjusted to provide an output signal when the signal from gage 378 reaches a predetermined voltage. The voltage at which 379 produces an output signal may be adjusted to produce a control output therefrom when a shock wave appears at and/or passes said gage. Notations 380 and 381 refer to amplifiers in the output of said pressure gage. The pulse output of gage 378 is then passed to a variable delay line 382 which may be adjusted to provide an output signal at a predetermined time in the cycle which signal may be used for energizing a valve, solenoid or other servo for creating one or more sparks in the shock tube such as by operating a servo motor or a solenoid actuated switch for discharging one or more condenser banks, or for effecting any control or servo action associated with the transient pressure process. By adjusting the delay line, the output signal therefrom may occur at any time interval in the cycle due to the fact that the input thereto is a function of the pressure variation and wave motion in the apparatus. The output of delay line 382 may be passed over multiple circuits to one or more devices such as a servo control or solenoid 384 for operating a first of the illustrated servos, or solenoid 386 for operating a second of the illustrated servos, to a delay-line 388 and then to a second servo or solenoid 388 for operating another of the illustrated valves or sparking devices 390 and to other servos or solenoids.

Transducers other than a pressure sensitive gage and relay may also be used to trigger or control servo operations which are thus synchronized to the pressure and wave motion in the intermittently operated wave generating apparatus described. For example, a photoelectric cell, scanning a light source or beam directed through a predetermined section of the duct or tube of FIG. 2 may be employed to detect the passage of an intense shock wave therein. For weaker shock detection, a photomultiplier tube device which scans the field of a Schlerein optical system may be used to detect the presence of a shock wave in the shock tube by variations in the received light as the shock wave passes.

Process apparatus utilizing such devices as the wave generating duct of FIG. 1 or 2 or the like is illustrated in FIGS. 20 and 21. In FIG. 20, a resonating wave tube 380 is mounted with the end portion 382 thereof extending into a second duct or container 384 in which is contained a liquid 386 completely or partially filling said container. Arrow notations 387 indicate the process liquid as being in motion past the end of the duct 382 which end is opened and projects below the surface of the liquid 386. The process liquid may also be stationary or adapted to be intermittently flowed past the open end 383 of duct 382 and removed from container 384 after a predetermined reaction thereon has taken place as the result of shock waves generated in 382 which intersect said liquid. The pressure effects of the intermittently produced shock waves which intersect the liquid in tube section 382, provide a pumping action which first forces some liquid out of said tube section 382 and during rarefaction draws it back into duct 382. Liquid from 384 is thus at least partly continuously replaced in tube 382 and if flow is provided by providing a pressure differential along the duct 384 using a pump upstream or downstream of the section illustrated, a substantial amount of the process liquid will be subjected to the temperature and pressure effects of said waves. The apparatus of FIG. 20 may also be operated in which the surface 386L of the liquid is always below the end of 382 thus permitting interaction of the gas above the liquid surface and admitted through inlet 388, with the liquid in container 384. Other modes of operation include completely filling duct 384 or partially filling it to a degree such that the liquid will never be driven out the end of section 383.

FIG. 21 is a schematic diagram of apparatus for changing the chemical and/or physical characteristics of liquids or suspensions or organisms in liquids by utilizing wave generating apparatus of the type described. The apparatus illustrated, includes means for effecting such reactions automatically and in accordance with a predetermined control sequence such that predetermined amounts of material may be predeterminately processed. In FIG. 21, a reaction chamber 392 is provided having walls of sufficient strength and sufficiently supported to withstand the forces and shocks applied thereto during operation. Protruding into and communicating with the interior 393 of the chamber 392 is an open ended shock tube 390 of the type described herein. The duct 390 is shown welded to the top wall 396 of the chamber 392 in a manner to effect a fluid seal therebetween. A bracket 398 supports duct 390 on the cover. The top wall 396 is preferably secured in sealing engagement to the bottom wall 394 of the vessel 392 so that fluid contained in said vessel will not be forced out during operation. An inlet valve 402 is secured to the top wall 396 of the vessel 392 for the admission of one or more liquids and/or gases thereto from an inlet line or lines 404. An exhaust tube 416 is welded to the vessel near the bottom portion of a sidewall. A solenoid valve 418 and pump (not shown) are used to effect the removal of liquid from the chamber, or gravity may be utilized to drawn off the reaction products.

The vessel 392 is filled to a selected level with a liquid, liquids or solid-liquid suspensions. If the liquid is pumped through the inlet valve 402 to completely fill the chamber, then the liquid in the tube 390 will always be subjected to shock waves without being substantially displaced. If the resonant wave apparatus of FIG. 1 is utilized as the tube 390, then said liquid will provide means whereby shock waves will react on and reflect off said liquid and thereafter propogate substantially in a manner similar to the waves propogated in a closed end tube.

For automatic operation of the apparatus of FIG. 21, a predetermined amount of liquid or flowable solid material is admitted to the chamber 392 to partly or completely fill said chamber. This may be effected predeterminately by operating the inlet valve while automatically controlling the operation of the piston and spark generating means for creating shock waves in duct 390. After a predetermined operating time in which shock waves are reflected off and/or partly absorbed by said liquid to effect a predetermined chamical or physical reaction, the exhaust or drain valve 417 is opened and reaction products are removed by the exhaust pump 418 and the cycle is repeated.

A multi-circuit self-recycling timer 412 is provided in the apparatus of FIG. 21 to operate each of the mentioned valve solenoids and servo-motors for predetermined time intervals to effect the above described actions in sequence. The timer 412 control circuits include a start control for the motor driving the piston in tube 390, a stop control for the servo or solenoid operating each valve and a start and stop control for each mentioned pump motor. When actuated by signals from timer 412, each of these servo devices operate the valves and other devices or by known means. Notation 400 refers to a motor driving paddles 408 in vessel 392 for circulating liquid therein during a reaction cycle.

FIGS. 22 and 23 show apparatus which employs shock tubes to heat and/or compress a fluid moving through a duct 430 to create a reaction therein. Notation 431 refers to a working section of a duct or pipe 430 through which a liquid, gas or vapor is flowing. In FIG. 23 a cross sectional view of the duct at the working section 431 is shown in three shock tubes 432, 434 and 436 secured to duct 430 by welding. If the shock tubes 432 to 436 are mounted within their axes in a single plane (perpendicular to the longitudinal axis of 430, and are equi-spaced at 120 degrees about 430, and shock waves are generated simultaneously in each and reach the chamber 431 simultaneously, then the effect will be such that all three shock waves simultaneously enter duct 430 and react on a predetermined portion of the fluid therein may be made to impart extremely high pressures and temperatures to the fluid therein. If the fluid in 430 is a mixture of two or more liquids, gases, vapors or combinations of these fluids, the effect of the high pressure and temperature of the simultaneously appearing and collapsing shock waves may be utilized to effect one or more particular chemical reactions between said fluids. Depending on the intensity of the shock waves, the dimension of the duct 430 and the characteristics of the reaction fluid(s) in 430, high reaction temperature may be experienced by the fluid near the center of duct 430. By utilizing two pairs of aligned and opposed shock tubes 432, the shock wave generated in each tube may be used to augment the rarefaction effect in the opposite tube and generate a resonant wave effect therein.

FIGS. 24 and 24' shown plural duct configurations for wave generating apparatus. Six auxiliary ducts 450, 452, 454, 456, 458 and 460 are shown with their open ends connected to a larger reaction chamber 440. The larger chamber 440 may be a shock tube in which shock waves are generated in accordance with the teachings of FIGS. 1 and 2 or may merely serve to receive waves from the auxiliary tubes connected thereto. Chamber 440 is shown modified with a hexagonal wall to facilitate securing the ducts 450–460 thereto. In FIG. 24', the tube 440 has a necked down section 442 which is coupled to a tubular section 446 of reduced diameter which may correspond in function to section 16 of FIGS. 1 and 2. The tubes 450 to 460 may be shock tubes adapted to simultaneously transmit shock waves to the main chamber 440 to collapse on a fluid injected therein through a nozzle or inlet valve 462 and, like the apparatus of FIGS. 22 and 23, serve to create chemical and/or physical changes in said injected fluid prior to its entry into the section 446. Notation 448 refers to a piston operating in section 446 for augmenting wave effects in the duct or to a valve. The tubes 450 to 460 may also be utilized for admitting a plurality of different fluids into the reaction chamber 440 by valving means or by resonant wave action involving flow in all said tubes.

FIGS. 25 and 25' show a spherical reaction chamber 464 into which multiple shock waves are directed, either one after the other in rapid succession or simultaneously from multiple shock tubes 477 to 480 to spherical chamber. Such an apparatus may be employed for reacting on a single fluid or mixture of fluids previously disposed in said spherical chamber 464 or predeterminately injected with respect to the appearance of shock waves therein.

The reaction chamber 464 consists of an assembly of semi-spherical shell sections 466 and 468 having flanges 470 and 472 circumscribing the edge of each and assembled face to face so as to seal said chamber to define an enclosed spherical reaction volume or zone 465 containing or terminating the illustrated piping connected thereto for the admission and removal of working fluid and products of reaction.

The chamber illustrated in FIG. 25 employs four shock tubes 477, 478, 479 and 480 of the type described. These tubes may be any suitable design and operation and have their exhaust ends secured flush to the spherical surface 465' of wall of the chamber. If said four tubes 477 to 480 are axially aligned and welded or otherwise secured to the wall 464' of the sphere at 120 degrees to each other, normal shock waves generated in each which simultaneously enter said chamber will define substantially an equilateral pyramidal configuration or volume the inside of which decreases rapidly in volume as said shock waves converge. The fluid within said decreasing volume is thus not only rapidly compressed during the time interval said shock waves are present in the chamber 465 but is heated to a high temperature, the value of which will be a function of the intensity of the shock waves, the dimension of the spherical volume and the characteristics of the fluid in the chamber.

Several modes of operation of the reaction apparatus of FIGS. 25 and 25' as well as FIGS. 26–28 are noted and include:

(a) In a first mode, the reaction apparatus operates by means of continuous injection of a single working fluid or mixture of fluids through a single injection nozzle 481 or nozzles and continuous removal of the products of reaction via an exhaust duct 482 positioned across chamber 464 from the inlet duct 481 or by means of a plurality of outlets while shock waves of the same intensity are generated in the shock tubes 477 to 480 at predetermined frequency and simultaneously enter the reaction zone 465.

(b) A second mode of operation involves the intermittent injection of predetermined quantities of a working fluid, or mixtures of fluids through a single inlet or injector 481 or through multiple inlets or the intermittent injection of predetermined quantities of multiple fluids such as liquids, gases, vapors, particles or combination of these materials injected in mixtures or through separated inlets so as to mix within the chamber 464. Each of said predetermined amounts of fluids may be injected into the zone 465 prior to the arrival of said shock waves at said chamber 464 or caused to flow by the action of the waves. The pressure increase in zone 465 resulting from the arrival of the shock waves therein, and/or auxiliary suction pump means may be provided to remove the products of reaction as described, with or without the use of an automatic valve.

(c) In a third mode of operation the shock waves introduced into the chamber 464 may be generated by means of apparatus of the type provided in FIGS. 1, 2 or 25. If the shock waves generated in all shock tubes 477 to 480 are timed so as to appear simultaneously in the chamber region 465 a resonating transient wave phenomenon in each of the tubes 477 to 480 may be sustained. Such resonant shock wave phenomena will be further augmented in another configuration in which tubes 477 to 480 are positioned opposite and aligned with each other across the chamber 464.

The tubes 477 to 480 may be welded or otherwise secured in sealing engagement with the chamber wall 464'. Notation 473 refers to a pressure seal such as a metal O-ring or other flexible metal seal seated in a channel 473' in one of the flange mating surfaces and provided as a closed loop. Bolts or fasteners 474 are used for clampingly engaging the flanges 470 and 472 together to effect assembly of the two half shells 466 and 468. Brackets 475 and 476 are bolted to the flanges 470 and 472 and are secured to upright supports 477 to 478 which are rigidly affixed to a frame or base 479 for holding the reaction apparatus in place.

FIGS. 26 to 28 show a number of assembly configurations of pressure wave generating apparatus of the type described involving a plurality of shock tubes which are placed in endwise abutment and are interconnected so that pressure or shock waves when predeterminately generated in each coact on a common fluid or fluids between the ends of said tubes. In FIG. 26 tubular shock wave generator 482 is provided which comprises two of the shock tubes of FIG. 1 in endwise abutment and communicating with each other. The reaction apparatus comprises a first chamber 483 of enlarged diameter having a reducing section 484 connected thereto extending to a smaller diameter section 485 which connects to an expanding section 486 of the same shape as 484. A second chamber 487 connects to the other end of section 485. It is assumed that the wave generating means of FIG. 1 or 2 as well as valve means as described is provided for each of the duct sections 483 and 487.

The center section 485 of the apparatus of FIG. 26 is preferably less than ½ the diameter of the end sections and approximately one sixth the total length of the tube 482. Connected to the center section 485 near or at its middle, are an inlet duct 488 for admitting fluid thereto and an exhaust duct 489 for removing fluid therefrom. By sparking electrodes or driving respective pistons in each of said end sections 483 and 487 so that waves generated in each travel simultaneously down the tubes towards each other and at the same rate a transient wave phenomenon is set up in each of the shock tube sections 483 and 487 which causes respective shock waves to be generated in the central reduced diameter sections which will converge towards each other and meet at or near the center of the duct. Depending on the characteristics of the fluid in the center section 485 and the intensity of the shock waves generated therein, the shock waves will partly reflect off each other and maintain the bi-directional wave motion in each half of section 485 and will provide a zone near the middle of section 485 the fluid of which will experience high compression forces and high temperatures as said waves approach each other. Notation 490 refers to cooling coils for circulating a coolant around the center of section 485 to help dissipate heat conducted through the gas to the walls of said tube and, in certain situations remove some of the heat of reaction. A fluid or fluids may be injected as described at a suitable time in each operating cycle and may be predeterminately removed from the central section during each cycle or after a predetermined plurality of cycles have caused a desired reaction to take place.

The apparatus of FIG. 27 is similar to that of FIG. 26 but is modified near the center of the reduced diameter section 485' at which is provided a reaction chamber or vessel 491 communicating with the two tubes. The vessel 491 is shown as a sphere although it may be any suitable shape, serves the function of the previously described configuration.

FIG. 28 shows apparatus similar to FIG. 27 having valves 492, 493, 494 and 495 respectively provided in the shock tube sections 16a and 16b, inlet line 488' and exhaust line 489' which may be operated in any of the described manners to serve the various functions described.

In FIG. 29 is shown a modification of the shaped shock tube reaction apparatus illustrated in FIGS. 1 and 2 operative to provide further wave augmenting effects beyond the primary chamber 12. Connected to the primary chamber section 12 is a first reducing fitting or section 14a of the type described which extends to a first reduced diameter tube 16a which extends to a second reducing section 14b extending to a further reduced diameter tube 16b. The oscillating wave motion set up in section 12 by one of the means described induces a shock wave of higher intensity in section 16a which in turn drives the fluid in section 16b in a manner so as to create a shock wave of still higher intensity therein.

FIGS. 30 and 31 illustrate wave generating apparatus of the type described utilizing a so-called free piston internal combustion engine to generate pressure waves in tubes such as 10 of FIG. 1. FIG. 30 shows the free piston apparatus as comprising a central engine block 520 containing a free piston assembly and auxiliary apparatus having shock tubes 12a' and 12b' of the type illustrated mounted aligned with said block at opposite ends thereof. If reduced diameter chambers 16a' and 16b' are provided and are respectively secured to the tubes 12, shock waves of high intensity may be generated in each by the operation of the engine which may be used to perform any of the described process functions in any of the illustrated configurations or other combinations of the described apparatus components.

FIG. 31 is a section taken through the longitudinal axis of the block 520 and shows components of the free piston engine which include a double headed piston assembly 526 having a first piston 528 connected by a rigid rod 523 of smaller diameter to a second piston 530. The pistons 528 and 530 are each operative to oscillate in respective chambers 529 and 533 of block 520 while the rod 532 slidably engages in a bore in a centrally located block 538 separating the chambers 529 and 533.

Fuel is admitted to the volumes 529 and 533 defined by each piston and the block 520 through respective injection nozzles 544 and 546 at or near the end of the compression stroke and may be ignited by conventional spark ignition means triggered by motion of said piston assembly or by compression ignition means. Notation 542 refers to spark plugs or so-called glow plugs which may be used to start or maintain ignition of the fuel during each cycle. The explosion action on the face 535 of each piston drives the assembly in one direction whereby the volume containing the burning gas expands until exhaust ports are cleared by the piston permitting the hot expanding gases to escape through a manifold 522. The manifolds 522 and 524 (one or more for each combustion chamber) may also be shock tubes utilized for process work of the type described or may be connected to drive a gas turbine for operating the illustrated or other auxiliary apparatus. The smooth bore 520' of each chamber extends to the ends of the block 520 where shock tubes 12a' and 12b' are bolted thereto. Oscillation of the piston assembly thus alternately creates a pressure wave in each duct which, if it is not a shock wave, may be amplified to become one by shaping the tube as illustrated in FIG. 1.

FIG. 32 shows apparatus for dispensing a fluid such as a liquid as an atomized spray by means of high pressure or shock waves. Various atomizing functions may be performed at high efficiency utilizing the apparatus of FIG. 32. Such functions as fuel and process mixing or atomization of liquids, the spraying of paints, carbeuration, fuel injection, etc. may be performed by apparatus of the type illustrated in FIG. 32 and the wave generating means provided therein.

The atomizing and mixing apparatus of FIG. 32 comprises a duct 560 in which intermittent shock waves are generated and travel towards an end of said duct which is closed off by a porous plug or plate 564 through which a liquid or gas is made to flow. A smaller duct 566 for the admission of said liquid terminates at a fitting 567 which is threaded or welded over a hole in the wall 561 of duct 560 which is aligned with a hole 564 provided through porous plug 564. Shock waves SW strike the inside surface of plug after forcing fluid in the duct to flow through said plug 564 and cause the liquid in said plug to be forced through the pores or capillaries in said plug and eject as a spray from the other surface 565 thereof. The shock waves also transfer heat to said porous plate thus heating said liquid and enhancing the atomizing action.

The apparatus of FIG. 33 provides means for continuously processing an elongated solid member such as a bar, rod, sheet or tube by subjecting at least part of the surface of said member to intermittent shock waves directed thereagainst while said member 582 is held or driven through in said apparatus. The apparatus comprises a shock tube, a portion of which is shown in cross section in FIG. 33, for generating and directing multiple shock waves against an elongated solid member 582 shown penetrating the end of tube 570 by passing through two gates 583 and 584 which sealingly engage the surface(s) of member 583. The gates 583 and 584 preferably comprise a pair of sealing pads or washers each having an opening of smaller area and shape than the cross section of the member 582 and each secured in a respective opening in the shock tube 570 and aligned across the walls thereof so that the member 582 will be held in a sealing manner yet will be capable of movement continuously through said tube while shock waves are generated therein.

In FIG. 33, the end wall of the shock tube 570 is made of a heavy block or plate of suitable metal or ceramic material which may be bolted or otherwise secured to the flanged end section 571 of the tube 570. A fitting 574 is secured and centrally mounted on plate 572 which may be a valve terminating a piping system for ducting either intermittently or continuously a fluid such as a liquid, gas or particles through an opening 573 therein. Other openings 578 and 589 which also terminate a fluid supply system are provided to supply the same or a different fluid to chamber 571. A single fluid or fluent solid material or multiple materials may thus be injected continuously or intermittently and synchronized to the generation of shock waves in chamber 571 to be directed against and coat, abrade, chemically react with, etch, erode or shape the material of member 582 as it is positioned within, intermittently or continuously driven through said shock tube by any suitable drive means. Powered rollers, for example, may be used to frictionally engage opposite surfaces of member 582 and drive it through chamber 571 at a predetermined speed.

If the member 582 is a circular rod, the gates 583 and 584 are preferably conventional sliding shaft seals. If 582 is a sheet, plate or bar, said seals 583 and 584 may be sliding seals of the desired shape employing one or more flexible pads with an opening therein shaped to engage all the surfaces of the member 582. In another embodiment, the end of the tube 570 may be made in two sections adapted to separate and close in sealing engagement against member 582. The upper section of reaction chamber or shock tube 570 may be separated from the lower end as shown in FIG. 34 by use of a rack gear 596 secured to the wall of 570', which may be raised and lowered by a motor driven pinion 598. The motor driving pinion 598 may be operated to raise 570 sufficiently to permit the member 582 to be moved a sufficient degree to expose a new length of 582 to the shock waves generated in 570' after the previous wave action has been completed on the prior length.

Various physical and chemical functions may be performed on member 582 as it remains in or is driven through the shock tube 570, viz:

(a) The surface of member 582 may be worked and/or heated by the multiple shock waves SW travelling along tube 570 and intersecting said surface. Such action may serve to heat the surface of member 582, heat treating or working same.

(b) The driving or working gas already in tube 570 may, by virtue of the effects of the shock waves generated in 570, react with the metal or material of member 582 to cure a coating applied to said surface or to chemically react therewith to improve its characteristics. The member 582 may act as a catalyst in a chemical reaction involving the fluid in duct 570.

(c) Liquids or solids such as particles may be injected into the chamber end 571 through nozzles 578 and 580 during the shock wave generation to chemically react with member 582 and/or fluids disposed therein or coated on the surface of member 582.

(d) Abrasive particles or surface working elements may be injected through inlet nozzles 578 to erode or work the surface of member 582.

(e) Combustible materials may be injected through nozzles 578 to further improve or predeterminately affect the action of the shock waves generated in 570.

Notation 574 refers to a multiple valve mounted on the end wall 572 of chamber 570 for controlling the admission and/or removal of reaction products admitted to chamber 571.

In FIG. 34, apparatus similar to that provided in FIG. 33 is applicable for effecting reaction kinetics involving shock waves operating on a surface or on materials or articles disposed on said surface. Such positioning device comprises, in FIG. 33 a rigid flight 586 of a conveyor. It may also comprise a belt such as a closed loop belt of a belt conveyor. Notation 586' refers to a rigidly supported table or bucking plate positioned in alignment with a movable shock tube 570' the end of which may be abutted against member 586 with sufficient force to effect a fluid tight seal therewith.

The articles 582a or otherwise provided material to be subjected to the intermittent shock wave action are conveyed by device 570' to a position below the end of the retracted tube 570', whereafter said tube is brought into abutment with the upper surface of member 586 by the operation of motor 585" driving pinion gear 585' which is coupled to move rack 585 up and down. After a predetermined amount of exposure of the material or articles 582a disposed on member 586 to the pressure-temperature effects of the shock waves and in certain instances to the fluid or particulated material injected during the generation of said shock waves, the wave motion is stopped and the tube 570' is raised to permit movement of the conveyor to remove the so-treated material and its replacement with another material beneath the end of the shock tube. The apparatus may be automatically controlled by automatically positioning material or articles on conveyor 586 and automatically starting and stopping the motor (not shown) which drives belt or conveyor 586.

FIG. 35 shows processing apparatus operative in a manner similar to that of the apparatus 10 of FIG. 1 save that other means are provided for exposing different surfaces of an article or articles to the direct force of shock waves generated intermittently in a shock tube 32 thereof, whereas in FIG. 33, a work member 582 was driven continuously through a reaction chamber in the working end of the tube, in FIG. 35 the article is placed on a movable plate or piston 593' and vibrated or tumbled to different attitudes or positions while high intensity pressure waves are generated in the chamber 571 and directed to strike said articles or material.

Conveying means for transferring material or articles to be treated in the working region 571a of the tube 570' in and out of said chamber are also provided and comprise a conveyor 590 which is illustrated as a motor driven belt and transfer apparatus 587 for pushing an article, articles or material off the end of the conveyor 590 through an opening at one side of said chamber 570' when a door 585a is open and for transferring same out of said chamber after a reaction or processing has been completed and a second door 585b in the other wall of the chamber is opened.

The reaction chamber comprises an elongated vessel or shock tube 570' having an end flange 611 which is bolted to a base plate 592a with a circumscribing sealing ring 590 disposed therebetween. A piston 593' having one or more piston rings 593a, slidably engages in the bore of chamber 570' and may be urged in short stroke movement up and down or longitudinally in the diameter by a lineal motor or hydraulic cylinder 593, the shaft 593b of which is secured to the piston 593'. The cylinder 593 is secured below to the base 592 supporting the base plate 592a and the chamber 570'. The piston 593' with articles or material thereon, may be raised or lowered a brief distance in intermittent and rapid manner by actuation of the lineal actuator 593 in a manner to cause articles thereon to bounce and/or shift position or attitude. By such tumbling or bouncing action, the various sides or surfaces of articles introduced into chamber 570' may be exposed to the direct effects of the pressure or shock waves generated within the chamber and if articles or particles are provided or layers, those underneath others will be vibrated to the surface with time thus providing means for exposing all of the material or articles to the direct effects of the shock waves.

The apparatus of FIG. 35 may be operated with all of the illustrated servo devices automatically controlled to operate at predetermined time intervals in a predetermined cycle by a multi-circuit cycle timer or other suitable automatic controller. The opposed doors 585a and 585b are opened by respective air or hydraulic cylinders 586a and 586b which are shown mounted on respective frames 586c and 586d secured to the walls of the chamber 570'. The doors 585a and 585b are pivotally mounted on hinges 595 secured to the walls of 570'. The shafts 596 of the door cylinders are provided with pins 597 which ride in slots 598' in brackets 598 permitting said doors to be pivoted when said cylinders retract. The forward thrust of the cylinders 586a and 586b may be used to effect a clamping seal between the doors and the openings in the chamber wall in which they nest. Notation 599 refers to fluid pressure seals provided secured to the doors which bear against the hatchways they nest in.

The transfer device 587 comprises a first air cylinder 589 which is movable on a trackway 588" by a second cylinder 588 secured to the framing 600 supporting the chamber, from a position above the conveyor 590 to the position shown whereby a blade 589' secured to the shaft of the ram of said cylinder 589 engages the top of conveyor 590. By projecting the blade 589' it can be used to push articles or material on the end of conveyor 590 through the open doorway in 570' into said chamber. At the end of the reaction cycle, the cylinder 586a FIG. 36 is a partly sectioned partial view of apparatus for shaping metal sheet or plate by means of multiple, intermittently produced shock waves. By clamping sheet material such as metal or plastic sheet in a die having a cavity protrusion or otherwise shaped portion disposed adjacent a first face of said sheet, and directing high intensity pressure waves such as shock waves against the other face of said sheet, the forces due to the intense pressure shock waves directed against the unsupported portion of the sheet and/or the intense head of the shock waves intersecting said sheet, may be operative to cause said sheet to deform against and conform to the walls of said die cavity or protrusion. Depending on the intensity of the shock waves, the sheet may be gradually or rapidly worked by each successive wave directed thereagainst to force said sheet to conform to the forming section of the die. Materials normally difficult to form by conventional press means may be so worked.

FIG. 36 shows details of fluid pressure forming apparatus 10 which comprises a reaction chamber 12 which may comprise or terminate a shock tube in which intermittent shock waves are generated by any suitable means such as the arcing of high intensity electrical sparks discharged across said chamber intermittent explosions generated therein by chemical or electrical means, etc. Reaction chamber 12 may also be provided in any suitable configuration or shape of chamber having means for generating shock waves of a desired intensity. Such waves or pressure pulses may be generated singly or in rapid succession as described. The chamber or tube 12 is provided with means 14 for raising and lowering said chamber against a bed 13 comprising a rigid platen or bench 15 in which is secured a die 16 shown having a cavity 17 into which a member 18 such as a sheet of metal is to be deformed by pressure and heat applied to one face thereof. The cavity 17 may be replaced with a flat platen if it is desired to work the surface of the member 18 such as in flattening or straightening said member, heat treating or work-hardening same. It is noted that by placing material such as metal powders or abrasive grit particles on the surface of member 18 they may be worked into or bonded onto said surface or operate to abrade said surface by the action of the shock waves thereon. A steel die (not shown) placed on said member 18 and free to move towards the die 16 may also be urged by the impact pressure of the pressure or shock waves generated in chamber 12 to shape or penetrate the surface of sheet 18. Such a die may be slidably engaged in the bore of chamber 12 or on sliding guides therein and may, when impacted by the shock waves generated in chamber 12 coact with the die 16 to shape or cut the sheet 18. Means for raising and lowering the chamber 12 is provided and comprises at least two hydraulic or air cylinders 20 and 21 which are supported on the frame 19 of the press, the rams 22 and 23 of which cylinders engage a flange 22 of the chamber 12 and preferably are attached thereto for assisting in raising as well as lowering the chamber 12 and forcing its lower rim into clamping engagement against the press bed and/or work 18. In FIG. 36 a circumscribing ridge-like protrusion or lip 23 projects from the open end-face 12' of the chamber and is adapted to be forced against the sheet 18 to effect a fluid pressure seal therewith. The lip or ring shaped rim 23 may be replaced by a sealing ring such as a metal seal or o-ring to effect such a circumscribing pressure seal. Upon clamping engagement of the flange 12' of the chamber 12 against the press bed 15, shock waves may be procued such as by exploding chemicals in said chamber 12 to effect the desired work forming, coating or cutting action on the member 18.

If work member 18 is metal or other thermoplastic material, it is noted that by producing a plurality of intermittent shock waves in the chamber 12 of FIG. 36, sufficient heat from said shock waves may be transferred thereto to raise its temperature a degree whereby it will become softened or rendered mallelable and more easily workable by the forces of the subsequent pressure or shock waves directed thereagainst. The degree of softening or increase in workability will be a function of the intensity of the shock waves generated, their frequency of appearance at the surface of member 18 and the physical characteristics as well as dimensions of the material 18 being worked or formed. By producing fluid pressure in excess of 10 p.s.i. shock waves of an intensity greater than Mach 2 and at a frequency in excess of 25 per second, most plastic or thin metal nonferrous sheets may be formed or worked as described. As the intensity and frequency of the shock waves are increased, the time required to work the member 18 will be decreased. Many materials not easily formed or worked by conventional means may be formed using fluid pressures or shock waves in excess of Mach 3 produced at frequencies in excess of 50 per second.

Notation 25 refers to one or more conduit or nozzle inlet means connected to the shock tube 12 for blowing or otherwise injecting a fluid or flowable particles into said tube and/or against the surface of the sheet or plate 18 while the shock waves are directed thereagainst. The heat and/or pressure of said shock waves may be used in coaction with the fluid or material injected through-conduit 25 to effect one or more physical and/or chemical reactions on member 18. Material injected through duct 25 may be used to perform one or more of the functions of abrading or roughening the surface of the work, coating or cladding said surface (which may or may not have been previously abraded by said action) with a protective coating or other material per se or during and in coaction with the forming action, effecting a chemical or physical reaction on said member 18 such as softening or cleaning said surface, etching or other chemical reaction which occurs with and is enhanced by said shock waves directed thereagainst. In certain of these fabrication or processing actions, the die 16 may be replaced by a flat platen and the rest of the illustrated structure may remain for merely processing sheets, plates or other shaped solids with shock waves and chemicals while said shapes are held stationary.

FIG. 37 shows in section details of apparatus for operating with shock waves on the major surface area of an article, only part of which is ordinarily exposed to said shock waves at a time. A shock tube 620 is provided the far end or working zone of which is illustrated as having a mount 627 secured to the end wall 625 which is secured normal to the longitudinal axis of the duct 620. The fixture 627 includes bearing means 628 for supporting a shaft 629 within the duct 620 on which the work 630 is mounted for rotation during or between the generation of shock waves in said tube. Flanges 631 of the fixture 627 may be bolted to the end plate 625 permitting it to be removed for repair or cleaning. A second shaft 632 passes through a rotary seal 633 in the end wall 625 and is coupled to shaft 629. Said shaft 632 may be coupled by an enclosed gear box to 629 or the latter may pass through a rotary seal in the side wall of 620. A motor 634 coupled to 632 drives the internally mounted shaft 629 and may be used to rotate the work 630 which may be clamped, bolted or otherwise secured to shaft 629 or to a fixture or in a cage rotationally secured to the fixture 627 and rotated when the shaft 629 rotates.

A door 626 is hinged to the side wall of 620 and is provided as an access to the working region of the shock duct for removing the work 630 and placing new work in the fixture. The door 626 is preferably provided with sealing means and a clamp 626'. Any of the heretofore described operations may be performed on the work 630 using shock waves. The numerals 622 and 624 refer to nozzles secured to the sidewalls of 620 for injecting fluids(s) and/or abrasive grit or coating material such as point into the chamber 620 while shock waves are striking the work 630. It is noted that, the heat as well as the pressure of the multiple shock waves striking the surface of the work 630 as solid or liquid material ejected from the nozzles 622 and 624 may coact to perform such functions as (a) condition the surface of 630 for abrading, cleaning or etching action, (b) effect the material ejected from the nozzles 624 and 624' and-/or the surface of 630 in such a manner as to improve its adherence to said surface. A so-called baked on finish such as accomplished by applying radiant heat to a painted surface may thus be effected with shock waves. The heat and mechanical energy of the waves may thus be used to physically and chemically change the structure of a coating material or catalyst sprayed against 630 as said waves intermittently strike said surface. It is noted that the fixture 627 of FIG. 36 may comprise a shaft or frame on a shaft supported and adapted to rotate on bearing supported by the side walls 621 and 621' of the shock tube 620.

FIG. 38 shows apparatus similar to that of FIG. 34 for subjecting the surface of a work member 646 to shock waves for processing, cleaning or coating purposes as described. The work member 646 of FIG. 38 has an exterior or workable surface larger than the cross-section of the end of the shock tube 640. The apparatus is utilizable where it is only desired to subject part of the surface of an object to the effects of shock waves or to selectively work or subject the surface to said shock wave effects. The tube 640 may be portable and a handle 645 may be provided for positioning and/or holding said tube end 641 is abutment against 646. The end 641 of said duct may comprise a resilient bell or ring shaped washer secured to the end of the tube 640 for effecting a sealing engagement with the work 646 should the latter be a little irregular or rough in shape. An inlet valve or pipe 642 may be used to inject a cleaning fluid or abrasive or other chemical into the tube 640 to act and be carried against the surface of the work by the shock waves generated therein. The numeral 644 refers to an exhaust line for removing material injected or admitted through 642.

FIG. 39 is a view of a modified piston design in cross-section whereby means are provided for the generation of a spark near the face of the piston. Said spark may be used to create shock wave phenomena which will augment the pressure wave generated as a result of the motion of the piston provided that said spark is generated at the proper instant in the cycle.

The piston assembly 106a has a longitudinal bore therethrough in which a rod shaped or tubular insulation 670 is secured. The insulator, preferably made of a plastic such as a fluorocarbon, or a ceramic such as the type used in spark plug design, houses and supports two electrodes 672 and 674 in spaced apart relation as shown. The ends 672' of the electrodes which project from the face of the piston 106' provide the gap across which the spark may jump. A single electrode may also be utilized with the spark jumping therefrom to the piston face which would be ground. A moving electrical coupling is provided with said electrodes comprising housing 676 in line with the end of the push rod 107' of the piston. The housing 676 is preferably made of an electrical insulating material such as a ceramic insulator or a plastic such as Teflon. The electrodes 672 and 674 project from the end of piston rod and penetrate the housing 676 through two holes which said electrodes slidably and sealingly engage therein. The ends of said electrodes slide back and forth in said holes through respective cavities 680 and 682 therein. Filling each of said cavities 680 and 682 is a quantity of liquid mercury which makes electrical contact with each electrode and a respective pin conductor 684 secured to said housing. Each of said pins 684 terminates a common electrical circuit which includes a source of high voltage current and means for discharging said current through one of said electrodes across said gap at the face of said piston.

Modifications to the apparatus of FIGS. 35 to 38 are noted as follows:

(a) The working fluid medium may comprise either a gas or a liquid in which shock waves are generated intermittently as described by spark discharge or chemical explosion means. The gas or liquid may be flowed into the respective chambers prior to each, working cycle after the chamber is closed and sealed and removed therefrom after completion of shock wave reaction on the work which may be admitted to the chamber as descriped. The flow of working fluid into and out of the chamber may be automatically controlled by means of an automatic controller or computer which also controls the means of an automatic controller or computer which also controls the means opening and closing the reaction chamber and the means generating shock waves.

(b) An intense radiation beam such as generated by a laser may be generated within the reaction chamber by a laser disposed therein or directed through a window or small opening in the chamber wall or a plurality of such beams may be so directed at sufficient intensity to generate one or more shock waves which travel and operate as described throughout the specification.

(c) In forming sheet or plate metal and other materials by shock waves as described in FIG. 36 gas such as air may be evacuated from the die cavity prior to forcing the sheet into said cavity to facilitate the formation thereof. Notation 610a refers to an opening in the die wall which extends from a passageway to which is connected a line extending from a vacuum pump through a controlled valve for evacuating fluid from the die.

FIG. 40 illustrates an apparatus 800 for generating and amplifying shock waves by electrical discharge means and applicable to the hereinbefore described forms of the invention. The plural shock wave generating apparatus comprises an elongated duct 801 shown having a constant cross section but which may have any suitable configuration which will perform a desired function including that shown in FIGS. 1 and 2. Notation 802 refers to the head end wall of duct 801 shown as semi-spherical of elliptical in shape. Near said end wall 802 are mounted a pair of electrodes 804 and 806 secured to the wall of the duct diametrically opposite each other across said duct and at a predetermined spacing which in FIG. 40 comprises substantially the inside diameter of said duct so that the ends of said electrodes do not protrude beyond the inside surface of the wall of said duct. In certain forms of the invention, the electrodes may project into the working volume 801' defined by duct 801. If the duct 801 is made of a non-conducting material such as glass or other suitable ceramic or is metal which is lined or coated on the inside with a non-cconducting or insultating material in the region of the electrodes 804 and 806, the generation of sufficient electrical potential at the positive electrode 804 will cause an intense spark to discharge across the interior volume 801' of the duct to the grounded electrode 806. Notations and refer to insulated mounts for the electrodes 804 and 806 which may be ceramic insulators secured to holes bored in the walls of the duct by ceramic cement or other means.

The generation of a spark between the electrodes 804 and 806 will cause a shock wave to form, part of which wave will travel down the tube 801 with a portion of the wave reflecting off the wall of the end wall 802. Downstream of the first pair of electrodes, 804 and 806, is situated a second pair of electrodes 812 and 814 also disposed on diametrically opposite portions of the wall of duct 801. If a spark is caused to jump across the second pair of electrodes just as a shock wave generated across the first electrode pair passes, said second spark may be used to enhance or amplify the shock wave formed by said spark arced across said first pair of electrodes. One or more additional pairs of electrodes may be provided farther down the tube to further amplify the shock wave generated by the first pair of electrodes if they are discharged in timed relationship to spark generation at each of the other electrodes.

In FIG. 40 means are provided for effecting synchronization of the spark generation across the illustrated pairs of electrodes 804, 806 and 812, 814 which means is also applicable to any number of electrodes. A source 822 of high voltage electrical energy is provided and is electrically connected in series to each of the electrodes 802 and 812, through a multi-position switch 820 which may comprise a beam switching tube or a rotary electro-mechanical switch driven by a motor. As the switch 820 operates to connect its input from voltage sources 822 with various outputs thereof extending to respective electrodes situated across different portions of the duct 801, high voltage energy is generated constantly or as a series of pulses at the output 824 of source 822. By controlling the rotation or switching rate of the switch 820, high intensity arcing or sparks may be made to jump the respective gaps across the tube and electrode pairs at the desired instant, so that the shock wave first generated at the first pair of electrodes nearest the end wall 802 will be amplified or continue undiminished in intensity as it travels down the tube 801. By controlling the intensity of the sparks and the timing in accordance with the geometry of the interior of the shock tube 801, resonant wave effects may be effected as in FIG. 1 to obtain wave amplification. It is noted that the tube 801 may have a variety of shapes including that of a hollow torroid or endless tunnel whereby a grate degree of wave amplification may be obtained by causing the wave to travel many times around the tube as properly timed sparks continue to amplify the originally generated shock wave to increase its intensity.

Further details of the apparatus 800 of FIG. 40 include an inlet nozzle 807' through which one or more working or reactant fluids are admitted to the volume 801' defined by the shock tube 801. A valve 808 communicates with the inlet nozzle 807' and is made in accordance with one of the hereinabove described valve structures. Said valve 808 is driven by a motor 809 to predeterminately admit fluid, preferably in a pulsed fashion, from line 807 which connects to a pressurized source of said fluid.

The described stepping switch 820 is shown driven by a variable speed controlled motor 817 of the output shaft 818 of which is connected to the shaft rotating the wiper means 820a of the rotary switch 820. A suitable brush element 821 connects the wiper means 820a with the output 824 of the source 822 of high voltage. The motor 817 is predeterminately controlled in speed by a conventional speed control unit 819 and the valve motor 809 is similarly controlled by a second speed control unit 810. A master controller such as multi-circuit predetermining timer or computer 811 generates signals on a plurality of the outputs thereof which are used to set or control speed controllers 810 and 819 and a control 823 for the source 822 of high voltage. A feedback signal is generated by a scanning means 816 which includes a Schlerein optical system for detecting the passage of shock waves along a predetermined portion of the shock tube 801 scanned thereby and the notation 815 refers to part of said system including a light source and optical means for generating an image of the shock wave at the scanning means 816, the latter being operative to generate a variable signal which it feeds to the master controller 811 for controlling the other variables described which includes the timing of the injection of input fluids and the timing of the generation of shock waves within the volume 801'.

In FIG. 41 is shown a modified form of the shock wave generating and reaction apparatus of FIG. 40. Whereas in FIG. 40, electrodes were disposed across diametrically opposite portions of the substantially constant diameter shock tube, in FIG. 41, the head end of the shock tube necks down to a reduced diameter portion 830 which is joined to the main duct portion 831 which corresponds to the duct 801 of FIG. 40. An expanding portion 831' of substantially smooth contour joins the necked down head end portion 830 with the main duct 831 and supports a pair of insulated electrodes 804 and 806 which are operatively connected in a circuit including means for generating sufficient electrical potential therebetween to cause intense spark generation across the gas volume defined between said electrodes by the head end portion 831. Notation 832 refers to insulating means disposed about the electrodes 804 and 806 and preferably provided as an annular ring of insulation material defining the complete wall of a portion of the duct 830 in the vicinity of the electrodes so as to prevent potential loss or discharge from the positive electrode 804 to the wall of the shock tube.

Shock waves generated by discharging sparks across the electrodes 804 and 806 travel through the expanding portion 830' and into the volume defined by the main portion 831 of the tube down which said shock waves travel and react on material disposed therein or adjacent the end thereof hereinbefore described.

Also shown in FIG. 41 is a valve 833 made in accordance with the hereinabove teaching and driven by a solenoid or motor 834 for injecting one or more fluids into the duct section 830, preferably as a series of fluid pulses generated in timed relationship to the sparks generated across the electrodes 804 and 806. Notations 835 and 836 refer to a plurality of inlet tubes operatively connected to the valve 833 for respectively admitting different fluids thereto and into the duct through the valve exhaust ports 833'. Either or both the fluids so admitted may be in one or more states including gases, vapors, liquids or particulate material operative to take part in the reaction, serve as a catalyst or be expelled from the end of duct 831 at high velocity as described.

FIG. 42 illustrates a modified form of the apparatus of FIG. 40 wherein a plurality of pairs of electrodes, two of which pairs are denoted in FIG. 42 by the notations 844, 845 and 844', 845' each disposed within respective sub-chambers 841 and 842 formed as cavities extending outwardly from the main wall 840 of the shock tube. Notation 843 refers to fluid inlet ducts communicating with the sub-chambers 842 and 843 for injecting one or more fluids therein to be carried into the main volume of the shock tube and to react as a result of spark discharge and shock waves generated by the electrodes which are insulatedly disposed within each sub-chamber.

In FIG. 43 is shown a modified form of reaction apparatus 850 having features as described. A reaction chamber 851 is provided which is substantially spherical or cylindrical in shape and has disposed across diametrically opposite portions thereof a plurality of pairs of electrodes, said pairs being defined by notations 854a, 854c and 854b, 854d. High potential electrical energy generated at one or more of said electrodes may be caused to arc completely across the reaction chamber volume 851' and/or to any of the other electrodes by controlling the potential of said electrodes. For example, assuming that it is desired to initiate an intense electrical spark at electrode 854a and to cause same to travel completely across volume 851' to electrode 854c without grounding to the closer electrodes 854b and 854d. Electrodes 854b and 854d may be charged so as to maintain both sufficiently positive during the timing desired to generate a spark across electrodes 854a and 854c to prevent the spark from arcing to either of the other electrodes. A modified form of the potential generating means provided in the apparatus of FIG. 40 may be employed to controllably build up potential on one or more of the electrodes of the apparatus of FIG. 43 to provide sequential arcing or spark discharge between any two or more pairs of electrodes thereof at any suitable frequency to react on one or more fluids such as gases, vapors, particulate material or liquids admitted to volume 851' through an inlet pipe 855 and an automatically controlled valve 956 disposed between 855 and an opening 852 in the wall of the reaction chamber 851.

Operation of the reaction apparatus of FIG. 43 may be effected in one or more manners such as the following:

(a) Sparks may be alternately discharged across pairs of electrodes diametrically disposed at opposite wall portions of the reaction chamber 851 with the frequency of discharge being either at a constant rate or at any predetermined rate depending on the type of reaction desired.

(b) Sparks may be predeterminately generated from one electrode to a plurality of other electrodes either simultaneously or in any desired sequence and that a controlled constant frequency or predetermined variable frequency and intensity.

(c) Sparks may be discharged across diametrically opposite electrodes and adjacent electrodes in predetermined sequence.

In FIG. 43, notation 857 refers to an exhaust duct connected to an opening 853 on the wall of the reaction chamber 851 to a valve 858 which, like valve 856, is preferably predeterminately controlled in its operation to remove the products of reaction either during each spark-generating cycle or after a predetermined number of cycles.

FIG. 44 shows a modified form of the reaction chamber of FIG. 43 wherein a plurality of electrodes 866a, 866b, 866c and 866d are each supported at adjacent portions of the spherical or cylindrical reaction chamber 861 and are each operative to be predeterminately fed into or adjacent the wall of the reaction chamber by respective servo motor drive means 867 to account for the erosion or consummation of said electrodes during the reaction process. The reaction apparatus 860 includes an inlet duct 864 and an exhaust duct 865 for respectively admitting reactant fluids and receiving the products of reaction as described. Valve means, not shown, in FIG. 44 may be disposed in the lines 864 and 865, as described.

FIG. 45 illustrates a modified form of the reaction chambers of FIGS. 43 and 44 and includes an apparatus 870 having a substantially spherical or cylindrical reaction chamber 871 which has a plurality of pairs of subchambers 876 extending outwardly from the main chamber 871 at diametrically opposite portions of the main chamber. Pairs of electrodes defined by notations 877 and 878 are insulatedly mounted within each sub-chamber for generating intense sparks therein which create shock waves which travel outwardly into the main chamber for reacting on fluids injected therein through plural inlet lines 872 and 874. If the shock waves so generated are generated simultaneously by simultaneously arcing the electrode pass, said shock waves may converge on the central portion of the volume 871' defined by chamber 871 and substantially compress and react on fluid disposed therein. Notations 873 and 875 refer to exhaust ducts disposed respectively opposite inlet ducts 872 and 874 for receiving fluids admitted to the reaction chamber 871 after they have been reacted on by the shock waves generated therein.

I claim:

1. Shock wave generating apparatus for creating a predetermined change in material comprising:
a reactor having a reaction chamber, said reaction chamber defining a wave-generating zone and a reaction zone and means joining the two zones so as to define a continuous fluid column, means for intermittently generating shock waves within said wave-generating zone and means for directing each of said shock waves from said wave-generating zone to said reaction zone at a frequency such that a reinforcing, moving shock wave effect is attained in the reaction zone and shock waves are repeatedly propagated through said reaction zone, means for admitting a working fluid capable of being chemically changed by shock waves to said reaction chamber, means for removing reaction products from said chamber, means for controlling the operation of said admitting means to admit fluid to said reaction chamber in synchronization with the operation of the means for generating shock waves in said wave-generating zone whereby said reinforcing shock wave effect is maintained in said reaction zone and the plurality of shock waves passing through said reaction zone are caused to react on matter admitted thereto, and means for periodically removing fluid from said reaction zone after it has been predeterminately changed in characteristic by the action of a plurality of shock waves directed thereagainst in moving through said reaction zone.

2. Shock wave generating apparatus in accordance with claim 1 wherein the means for generating shock waves in said wave generating zone comprises piston means, means for oscillating said piston means in said wave-generating zone to generate first waves in said fluid column and means for amplifying the waves so generated and applying same to create shock waves in said reaction zone.

3. Shock wave generating and reaction apparatus in accordance with claim 2, including auxiliary wave amplifying means comprising spark generating means having electrodes across which sparks may be discharged and means for synchronizing the operation of said spark-generating means and the movement of said piston to generate electrical discharges of sufficient intensity and at times such as to amplify the waves generated by said piston means and create shock waves.

4. Apparatus in accordance with claim 1 wherein said reaction zone of said chamber has a cross-section which is smaller than the cross-section of the volume defining said wave-generating zone, means connecting said reaction and wave-generating zones comprising a duct of decreasing cross-section.

5. Apparatus in accordance with claim 1, said admitting means being located in said reaction zone and comprising value means variably operable whereby variations in the timing and amount of fluid removed from said reaction zone and admitted thereto may be effected.

6. Apparatus in accordance with claim 1, said admitting means comprising a plurality of valves including an inlet valve and an exhaut valve aligned with each other across said reaction chamber, a supply of fluid connected to said inlet valve, means for controllably operating said two valves, means for pressurizing said fluid so as to cause it to flow through said inlet valve and to assist in scavaging part of the fluid in said chamber by causing its flow through said exhaust valve when said valves are open.

7. Shock wave generating apparatus for creating a predetermined change in matter comprising in combination with a reaction chamber defining a first zone in which shock waves are generated and a second zone communicating with said first zone in which a change in matter is effected as the result the heat and pressure of said shock waves, electric arc-generating means including a plurality of electrodes communicating with said first zone, a source of high-voltage electrical energy of sufficient potential to generate an electric arc which, when discharged across said electrodes, is of sufficient intensity to create shock waves in said first zone capable of propogating to said zone, switching means operative connected to said source of high-voltage electrical energy and said electrodes, and means for operating said switching means in a manner to intermittently arc said electrodes so as to intermittently generate shock waves which propogate between said first and second zones at intensities for creating a predetermined change in matter disposed in said second zone.

8. Apparatus in accordance with claim 7, each of said electrodes being located within said reaction chamber across an opposite wall thereof and aligned with each other so as to effect the generation of an electric arc directly across said chamber when said electrical energy is discharged across said electrodes.

9. Shock wave-generating apparatus for creating a predetermined change in material comprising:
   a reactor having a reaction chamber,
   said reaction chamber defining:
      a wave-generating zone and
      a reaction zone,
      means joining the two zones so as to define a continuous fluid column,
   means for intermittently generating shock waves within said wave-generating zone,
   means for directing said shock waves from said wave-generating zone to said reaction zone,
   means for controllably intermittently admitting a working material to said reaction zone which working material is capable of being chemically changed by the shock waves directed into said reaction zone,
   means for removing the products of reaction from said reaction zone,
   means for controlling the operation of said admitting means to admit fluid to said reaction chamber in synchronization with the operation of said means for generating shock waves in said wave-generating zone whereby the shock waves passed to said reaction zone are caused to predeterminately react upon and effect changes in matter admitted to said reaction chamber, and
   means for periodically removing material from said reaction zone after it has been reacted upon by at least one of said shock waves directed thereagainst from said shock wave-generating zone.

10. Shock wave-generating apparatus in accordance with claim 9 wherein said reactor is includes a spherical reaction chamber.

11. Shock wave-generating apparatus in accordance with claim 10 wherein said means for intermittently generating shock waves comprises electrode means and means for generating intense electrical discharges across said electrode means which electrical discharges are operable to generate said shock waves.

12. Shock wave-generating apparatus for creating a predetermined change in material comprising:
   a reactor having a reaction chamber defining a reaction zone,
   means for intermittently injecting material to be reacted on into said reaction zone of said reaction chamber,
   means for generating a plurality of separate shock waves and means for simultaneously directing said separate shock waves into said reaction zone in a manner such that said separate shock waves are directed towards each other and respectively converge on the material injected into said reaction zone and wherein said material is substantially simultaneously subjected to the heat and pressure of each of said shock waves in said reaction zone and,
   means for removing material from said reaction zone after said material has been reacted upon by said simultaneously generated shock waves.

13. Shock wave-generating apparatus in accordance with claim 12 having a plurality of ducts defining branch passageways extending from said reaction chamber along each of which branch passageways respective of said simultaneously generated shock waves may be directed towards said reaction zone, said branch passageways communicating with said reaction zone.

14. Shock wave generating apparatus in accordance with claim 13 wherein at least two of said ducts are disposed in axial alignment with each other.

15. Shock wave generating apparatus in accordance with claim 13 wherein the axes of said ducts are disposed substantially 120 degrees apart from each other and are directed substantially towards the center of said reaction zone.

16. Shock wave generating apparatus in accordance with claim 12 wherein said means for simultaneously, directing said shock waves into said reaction zone is configured to direct said shock waves towards each other along substantially the same axis.

17. Improved method for producing effects of the character described in a substance by sound waves which comprises applying to said substance large-amplitude sound waves in a substantially closed system in which a non-linear wave performs a periodic excursion, periodically reinforcing such wave at at least one point of the system, and synchronizing such periodic reinforcements with the motion of the wave.

18. Improved apparatus for producing effects to the character described in a substance comprising a substantially closed chamber, means for producing in and applying to said substance periodic large-amplitude nonlinear waves acting upon said substance in said chamber, periodically reinforcing said non-linear waves at at least one point in said chamber and synchronizing said periodic reinforcements with the motion of said waves.

19. In a shock wave generating apparatus for creating a predetermined change in matter comprising:
- a reactor including a reaction chamber defining a reaction zone,
- means for controllably admitting matter to be reacted on to said reaction zone of said reaction chamber,
- means for simultaneously generating and directing a plurality of separate shock waves at matter disposed within said reaction zone wherein said separate shock waves converge on said matter in said reaction zone and simultaneously react on said matter by subjecting said matter to the heat and pressure of said shock waves, and
- means for removing matter from said reaction zone after a reaction has taken place within said reaction zone by the simultaneous action of said plurality of shock waves.

20. Shock wave generating apparatus in accordance with claim 19 including means for controlling said shock wave generating means to cause the simulatenous generation of said shock waves and the movement of said shock waves through said reaction zone in synchronization with the operation of said means for controllably admitting matter to said reaction chamber.

21. An apparatus in accordance with claim 20 including means for controllably removing matter from said reaction zone of said reaction chamber in synchronization with said means for controllably admitting matter to said reaction chamber.

22. Shock wave generating apparatus in accordance with claim 19 wherein said plurality of shock waves are simultaneously caused to converge on said matter from respective different directions.

* * * * *